(12) United States Patent
Seki et al.

(10) Patent No.: US 11,417,584 B2
(45) Date of Patent: Aug. 16, 2022

(54) SEMICONDUCTOR DEVICE

(71) Applicant: SONY SEMICONDUCTOR SOLUTIONS CORPORATION, Kanagawa (JP)

(72) Inventors: Kousuke Seki, Kanagawa (JP); Yusaku Kato, Kanagawa (JP); Shusaku Yanagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 70 days.

(21) Appl. No.: 16/647,548

(22) PCT Filed: Sep. 11, 2018

(86) PCT No.: PCT/JP2018/033551
§ 371 (c)(1),
(2) Date: Mar. 16, 2020

(87) PCT Pub. No.: WO2019/059033
PCT Pub. Date: Mar. 28, 2019

(65) Prior Publication Data
US 2020/0219791 A1 Jul. 9, 2020

(30) Foreign Application Priority Data
Sep. 25, 2017 (JP) .............................. JP2017-183931

(51) Int. Cl.
*H01L 23/433* (2006.01)
*H01L 21/48* (2006.01)
(Continued)

(52) U.S. Cl.
CPC ........ *H01L 23/433* (2013.01); *H01L 21/4871* (2013.01); *H01L 23/13* (2013.01);
(Continued)

(58) Field of Classification Search
CPC ..... H01L 21/4871; H01L 23/13; H01L 23/15; H01L 23/36; H01L 23/433; H01L 23/473; H01L 23/49838; H01L 24/16
See application file for complete search history.

(56) References Cited

U.S. PATENT DOCUMENTS

2002/0113141 A1* 8/2002 Malone ............... H01L 23/4336
239/124
2005/0047090 A1* 3/2005 Tonosaki ................ G06F 1/203
361/700
(Continued)

FOREIGN PATENT DOCUMENTS

CN 1602406 A 3/2005
CN 202889855 U 4/2013
(Continued)

OTHER PUBLICATIONS

International Search Report and Written Opinion of PCT Application No. PCT/JP2018/033551, dated Nov. 20, 2018, 10 pages of ISRWO.

*Primary Examiner* — Andres Munoz
(74) *Attorney, Agent, or Firm* — Chip Law Group

(57) ABSTRACT

The present technology relates to a semiconductor device that makes it possible to enhance a heat dissipation capacity without occurrence of a fluctuation in high frequency characteristics. A glass substrate is adhered to a wiring layer-attached glass substrate, and a heat dissipation part is formed between the wiring layer-attached glass substrate and the glass substrate. The present disclosure is applicable to, for example, a high-frequency module and a high-speed communication module.

16 Claims, 29 Drawing Sheets

(51) Int. Cl.
*H01L 23/13* (2006.01)
*H01L 23/498* (2006.01)
*H01L 23/00* (2006.01)

(52) U.S. Cl.
CPC ........ *H01L 23/49838* (2013.01); *H01L 24/16* (2013.01); *H01L 2224/16227* (2013.01)

(56) References Cited

U.S. PATENT DOCUMENTS

| | | | | |
|---|---|---|---|---|
| 2007/0227697 | A1* | 10/2007 | Takahashi | H01L 23/473 165/80.4 |
| 2008/0205002 | A1 | 8/2008 | Chui | |
| 2013/0039010 | A1* | 2/2013 | Mori | H01L 21/4882 361/699 |
| 2020/0402873 | A1* | 12/2020 | Kohama | H01L 23/13 |

FOREIGN PATENT DOCUMENTS

| | | | | |
|---|---|---|---|---|
| JP | 06188326 | A * | 7/1994 | ............ H01L 23/10 |
| JP | 2000-138485 | A | 5/2000 | |
| JP | 2003-185369 | A | 7/2003 | |
| JP | 2011-145044 | A | 7/2011 | |
| JP | 2012-233642 | A | 11/2012 | |
| JP | 2014120516 | A * | 6/2014 | |
| JP | 2015-010765 | A | 1/2015 | |
| KR | 10-0905485 | B1 | 7/2009 | |
| TW | 201202649 | A | 1/2012 | |
| WO | 2003/050465 | A1 | 6/2003 | |
| WO | 2012/154148 | A2 | 11/2012 | |

* cited by examiner

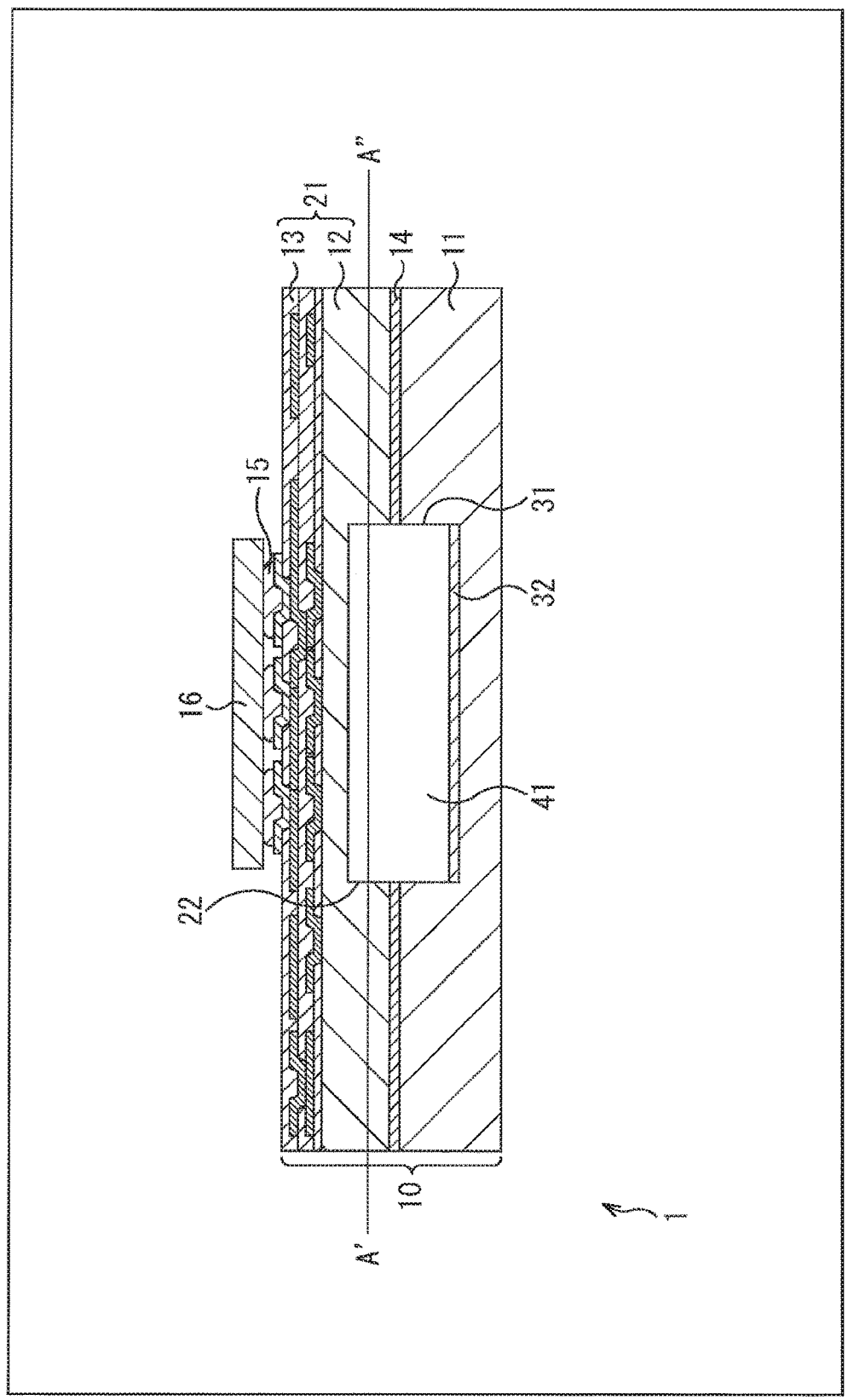
[FIG. 1]

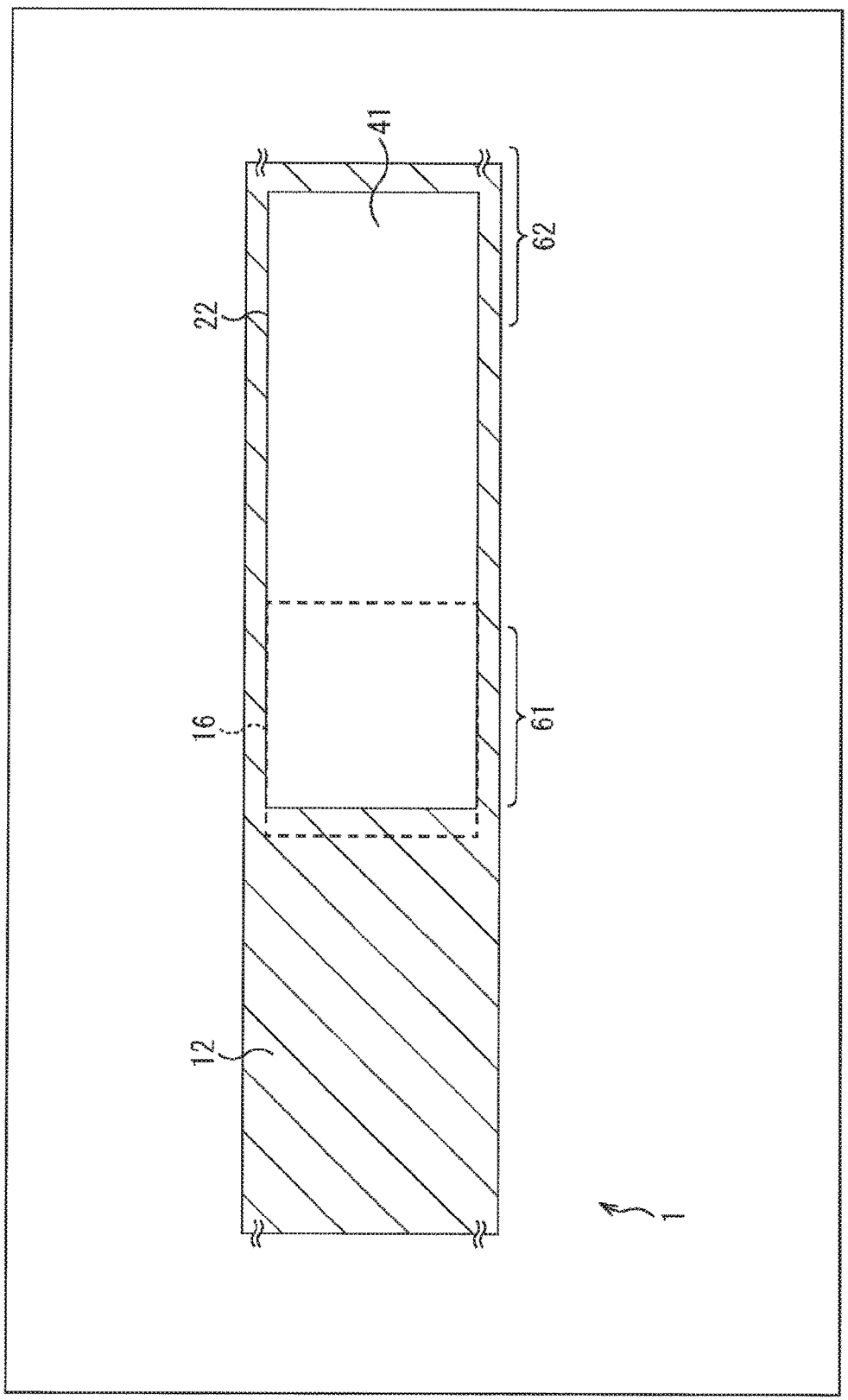

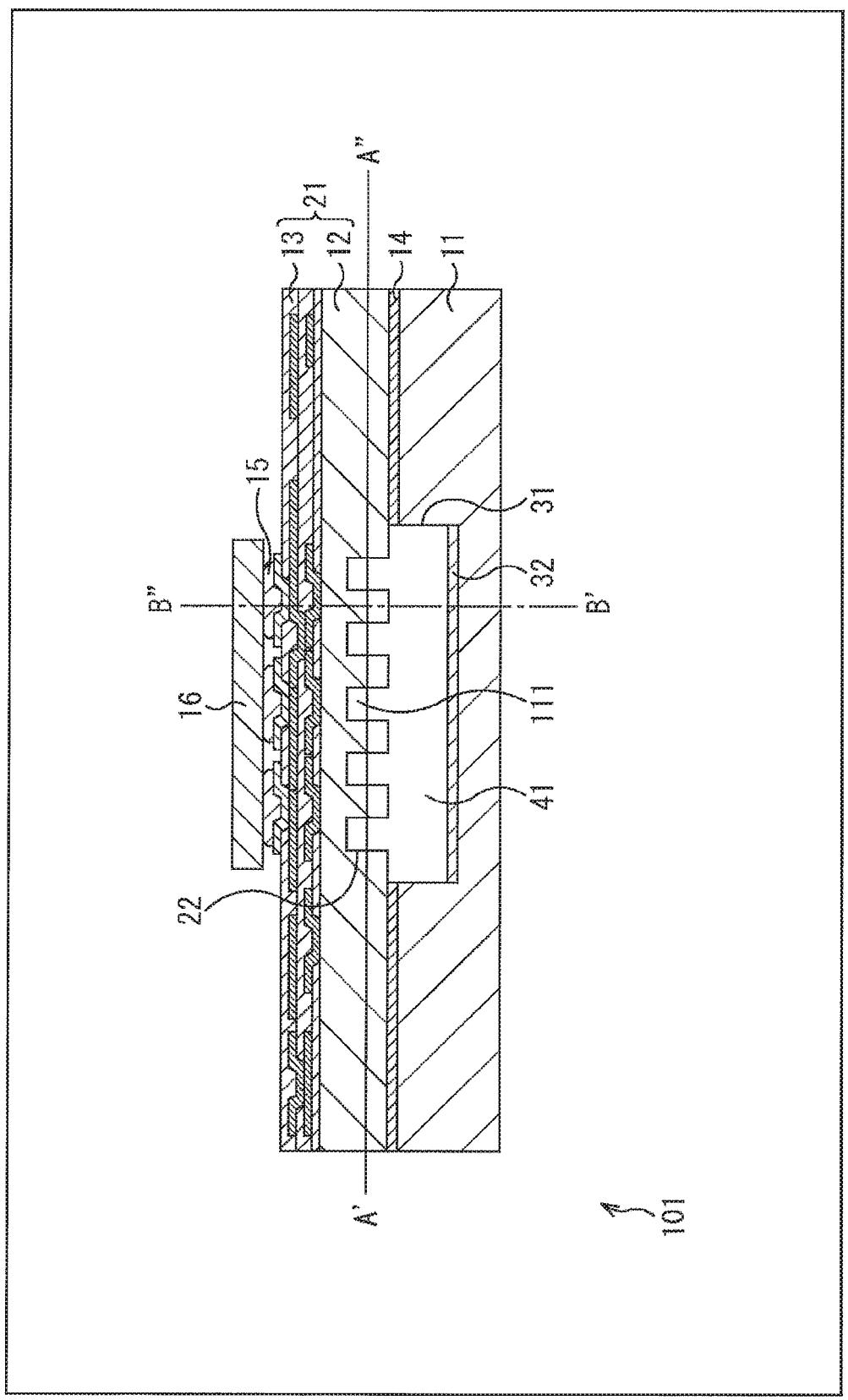
[FIG. 3]

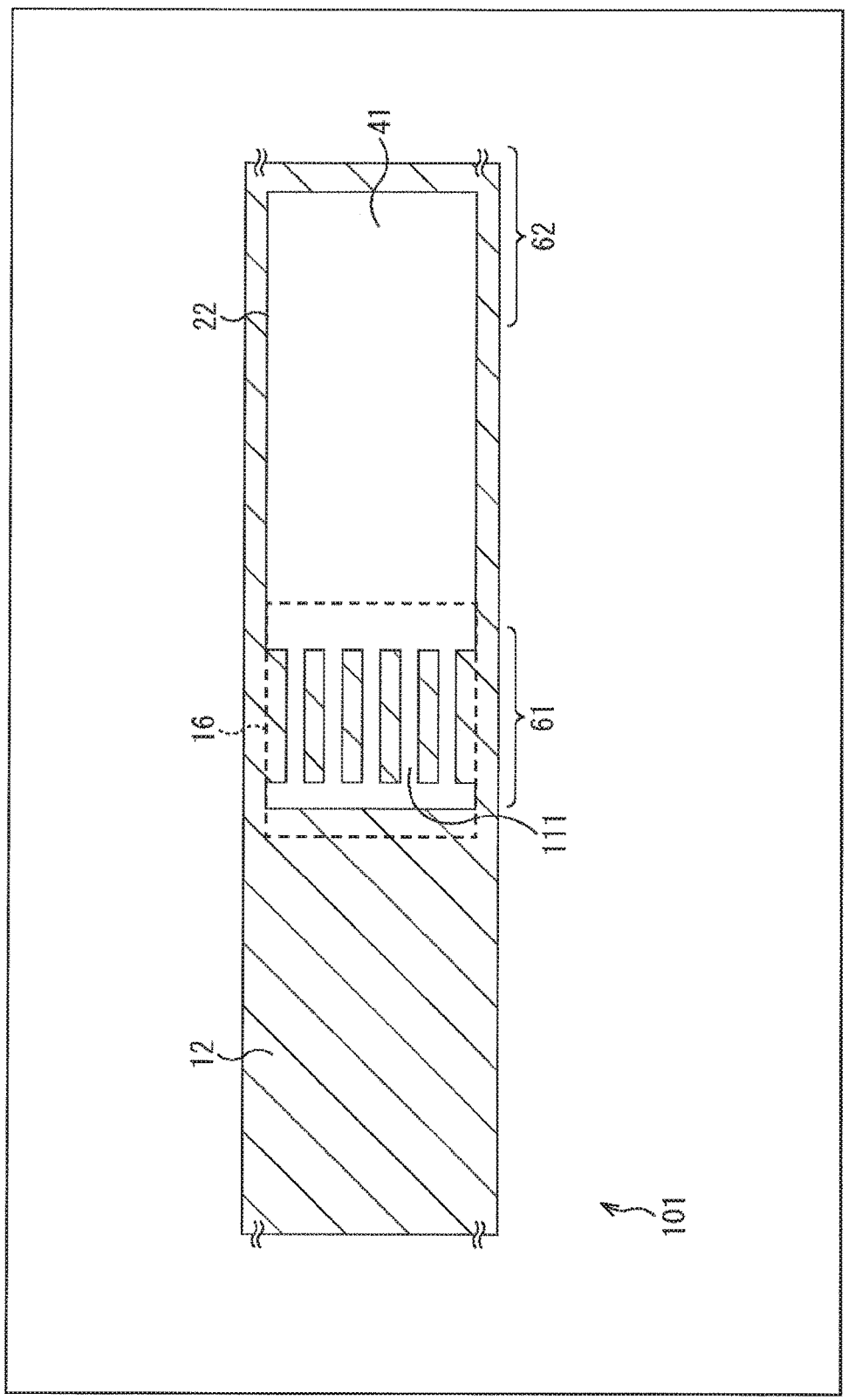
[FIG. 4]

[FIG. 5]
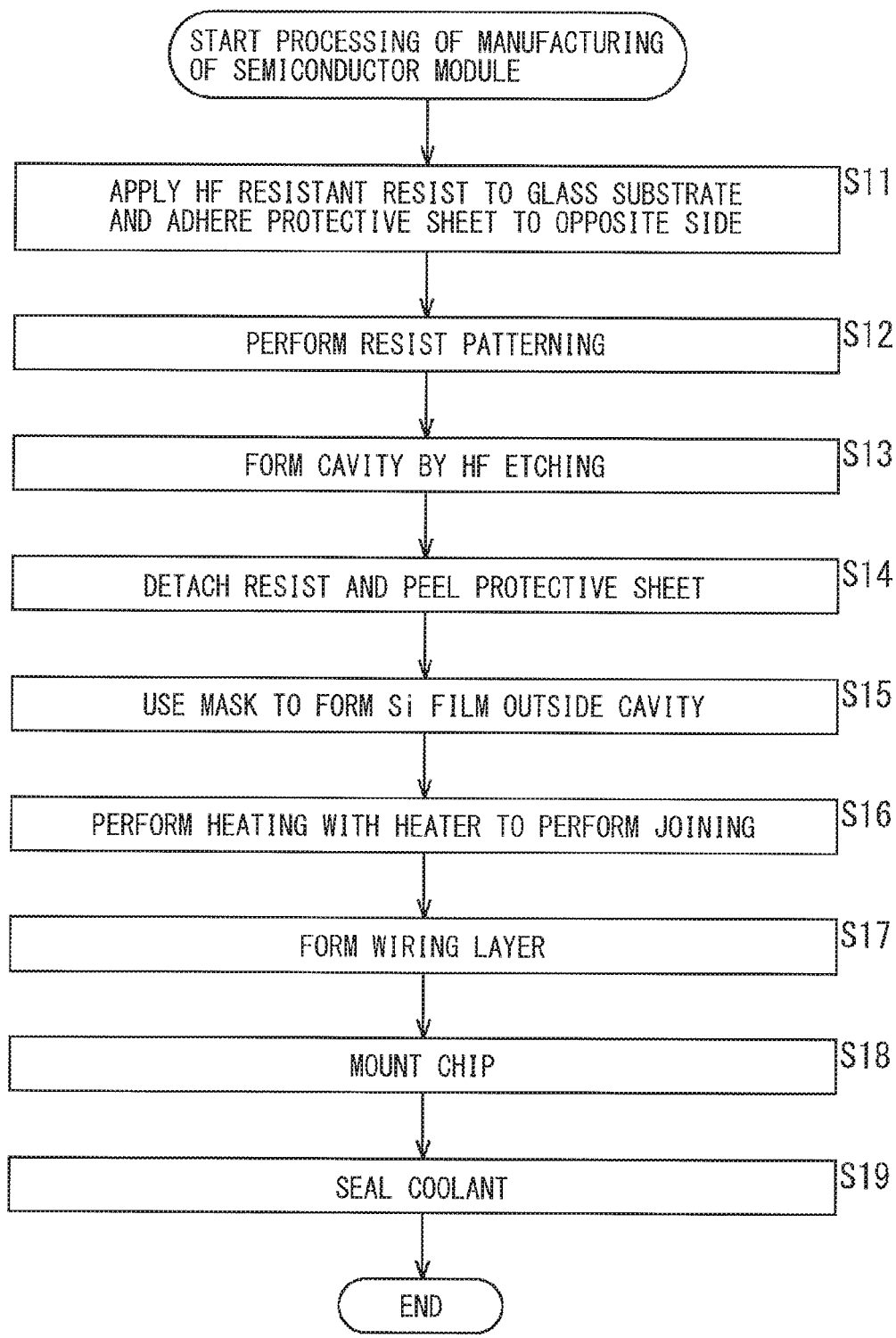

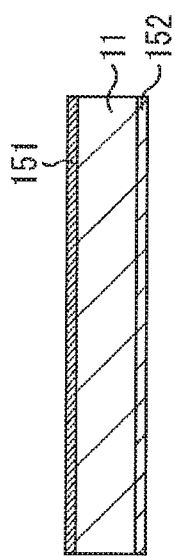
[FIG. 6A]
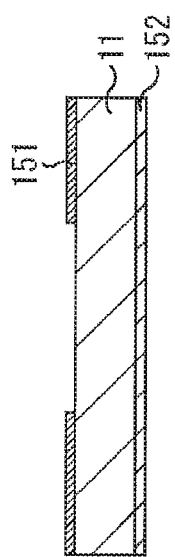
[FIG. 6B]
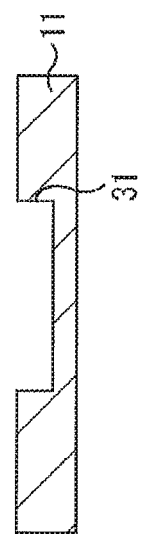
[FIG. 6C]
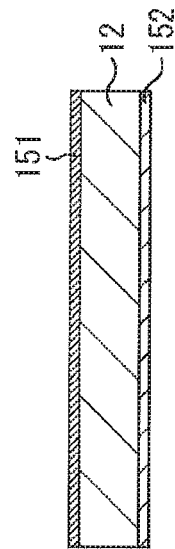
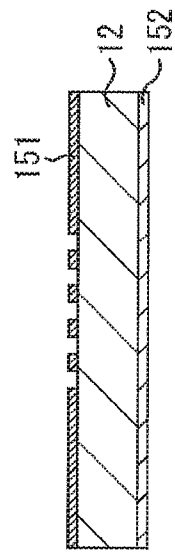
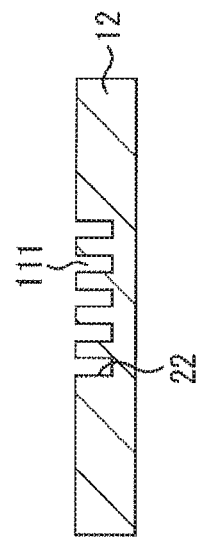

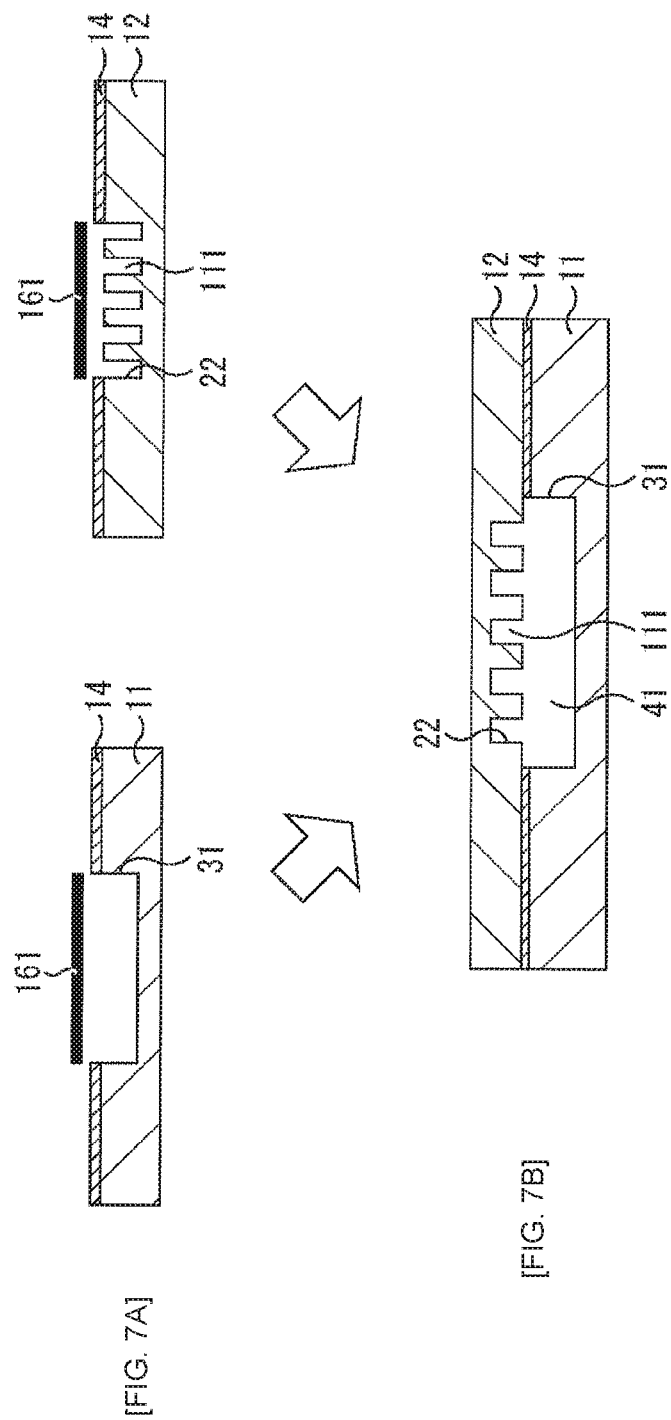

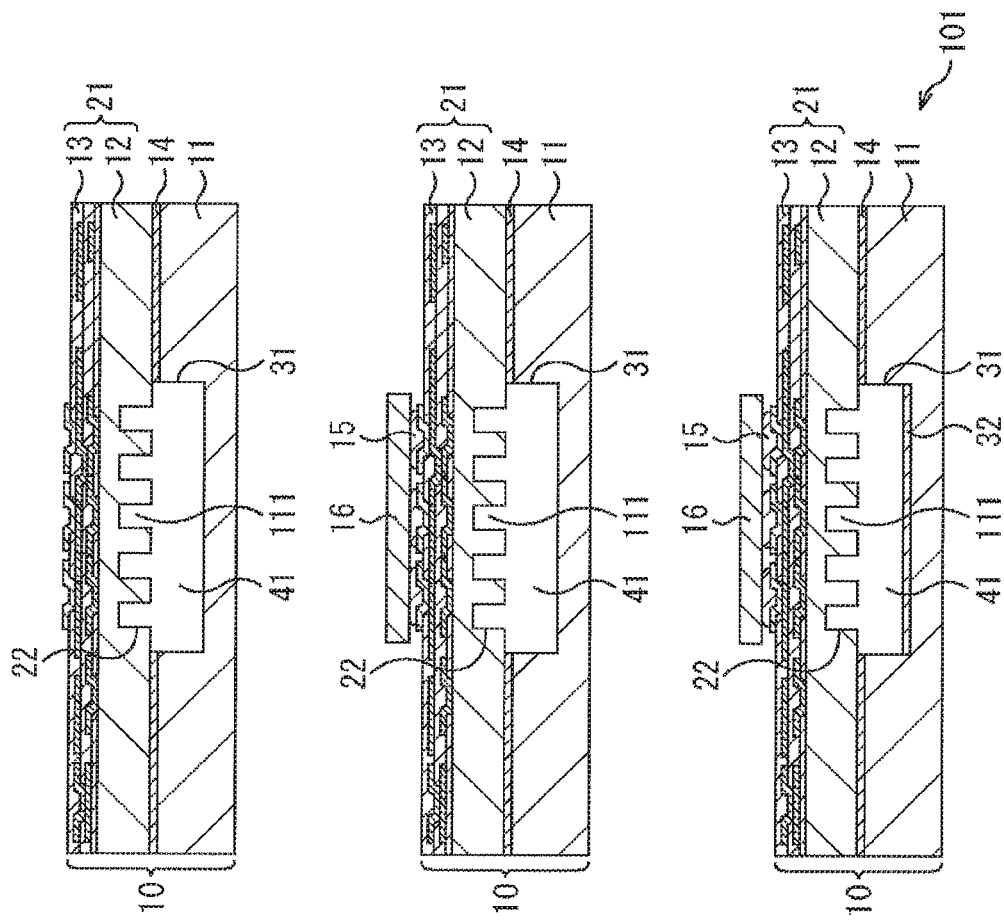

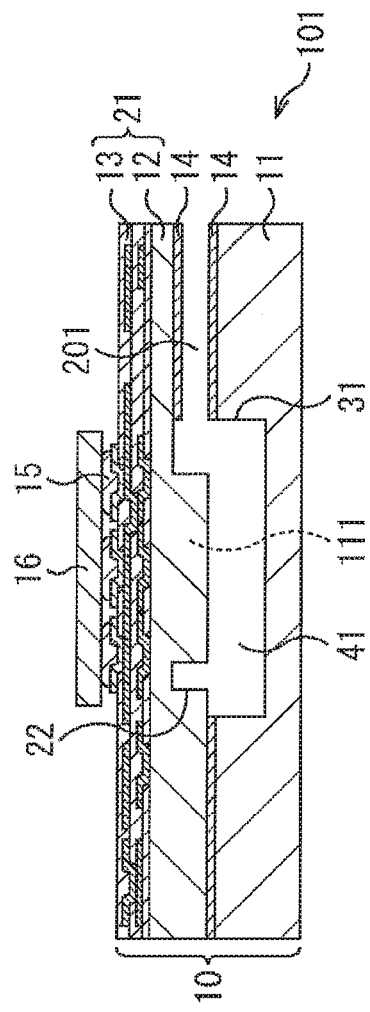
[FIG. 9A]
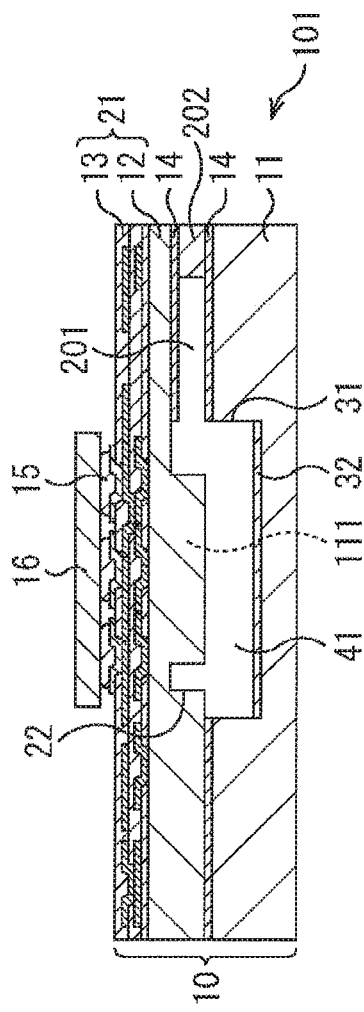
[FIG. 9B]

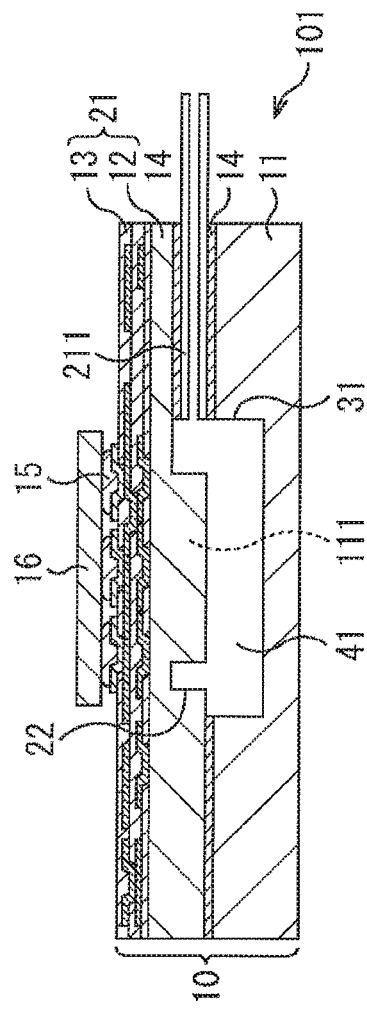
[FIG. 10A]
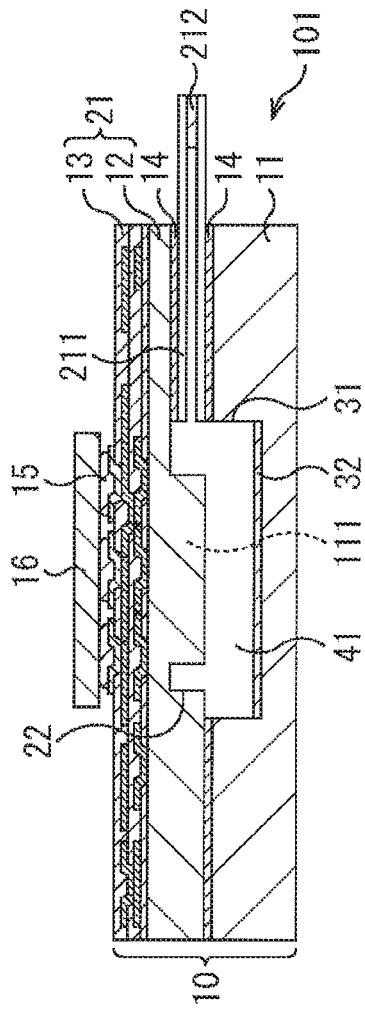
[FIG. 10B]

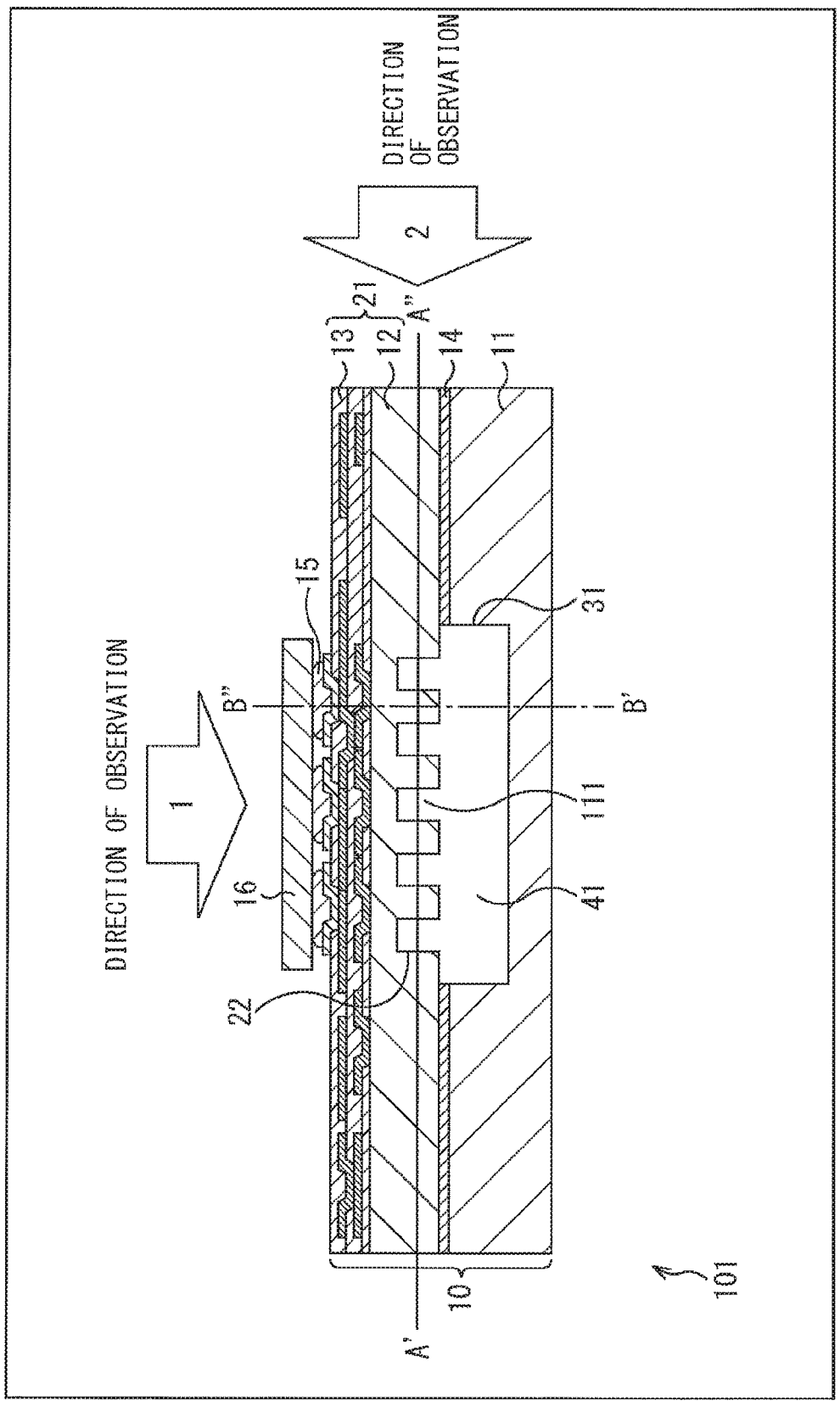
[FIG. 11]

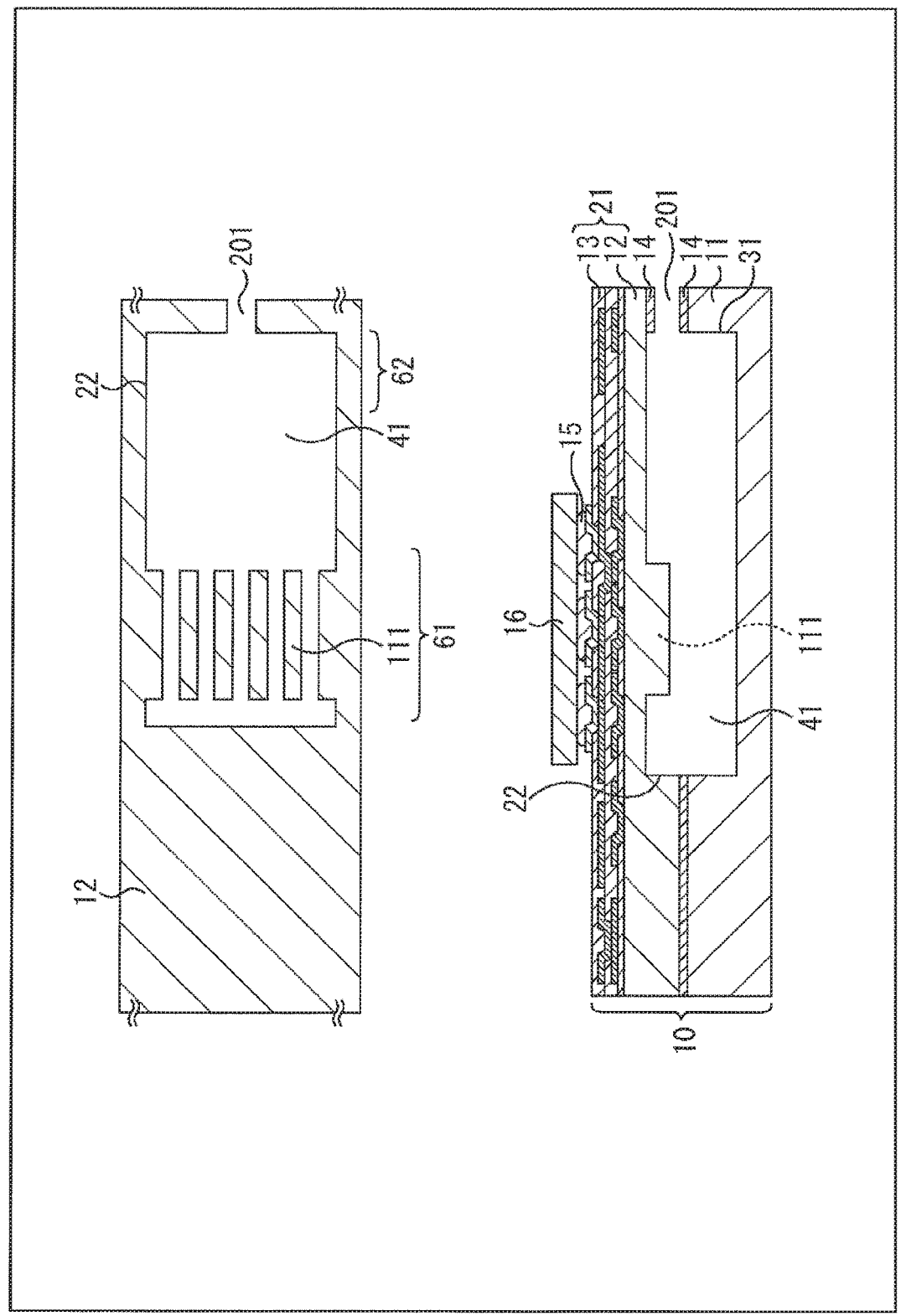
[FIG. 12]

[FIG. 13]
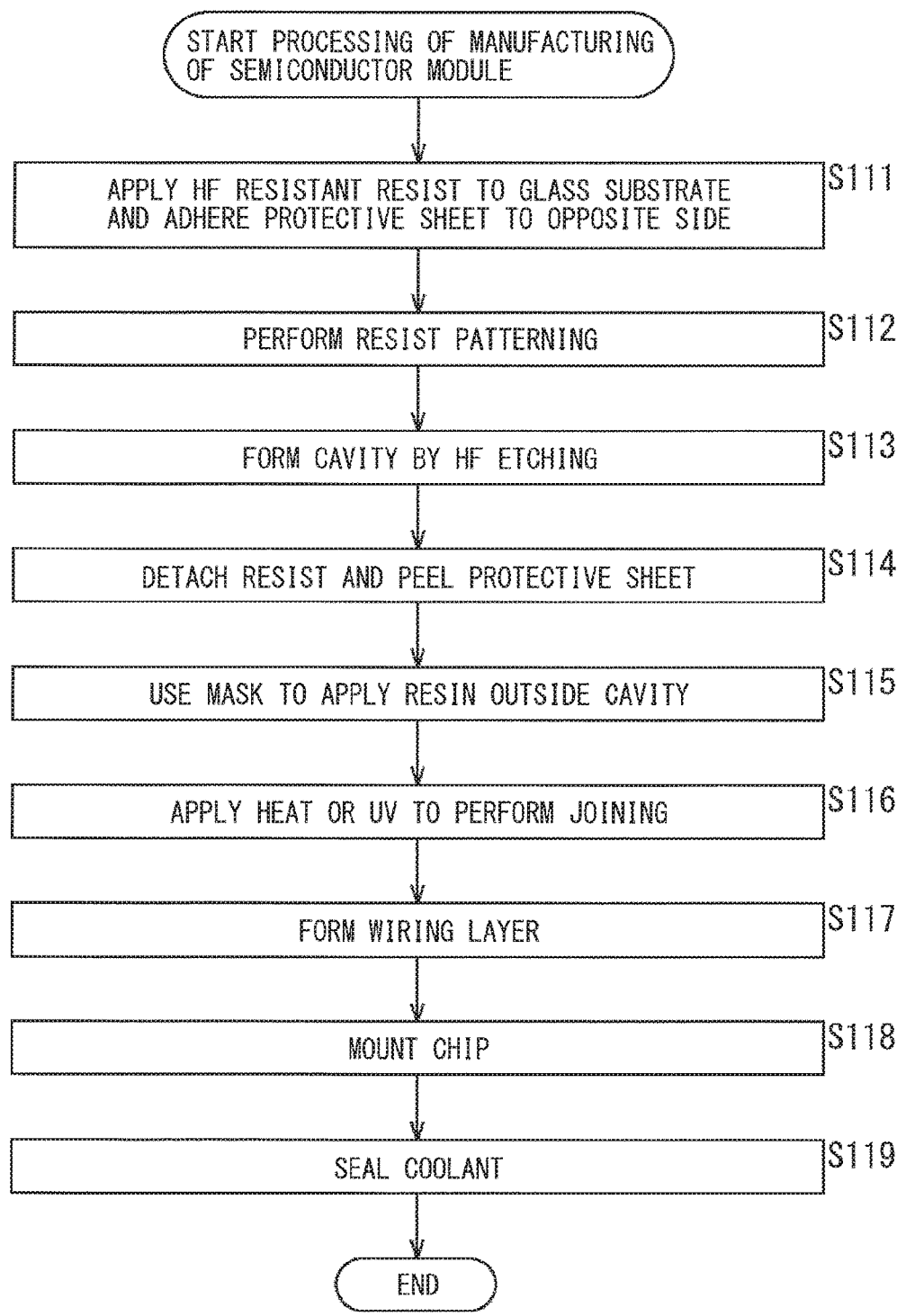

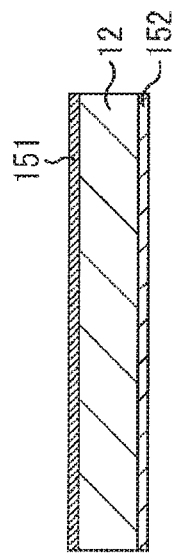
[FIG. 14A]
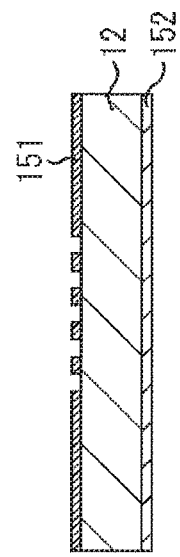
[FIG. 14B]
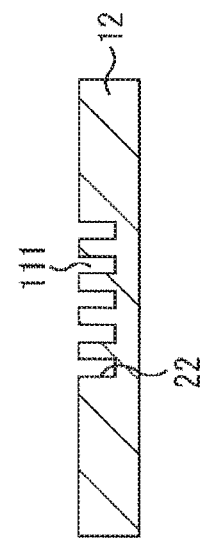
[FIG. 14C]

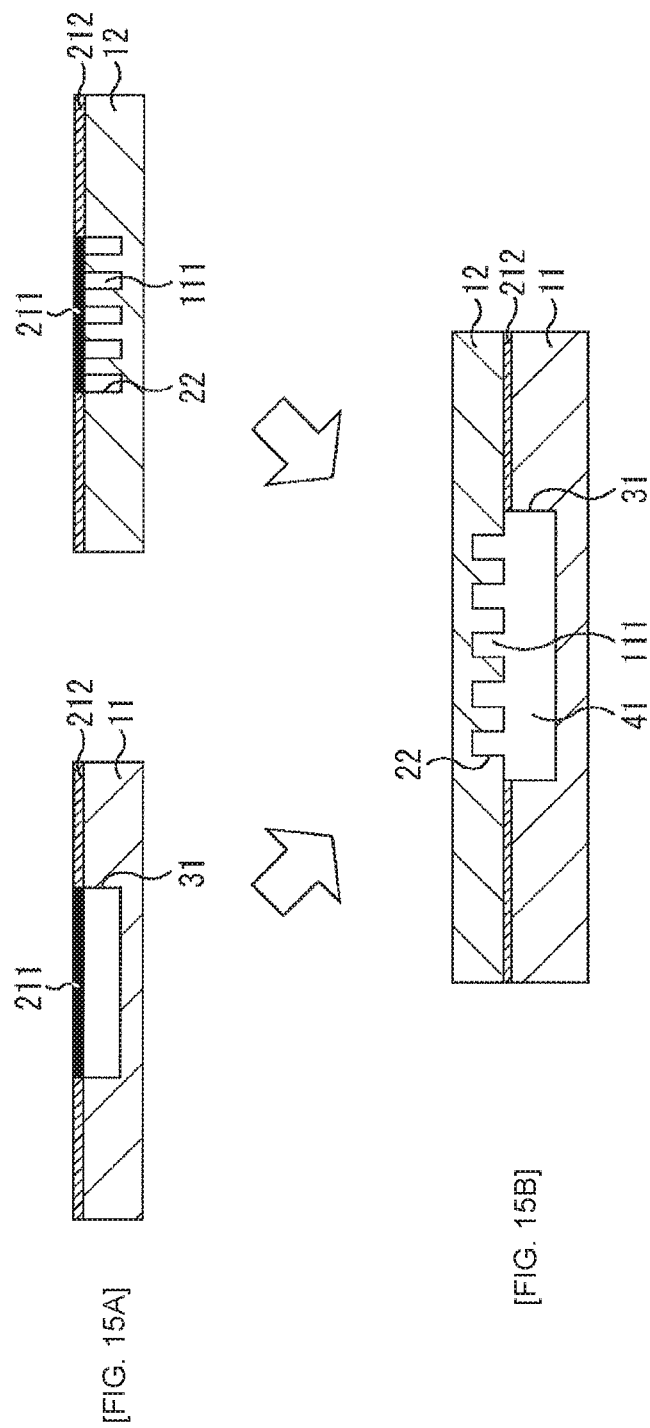

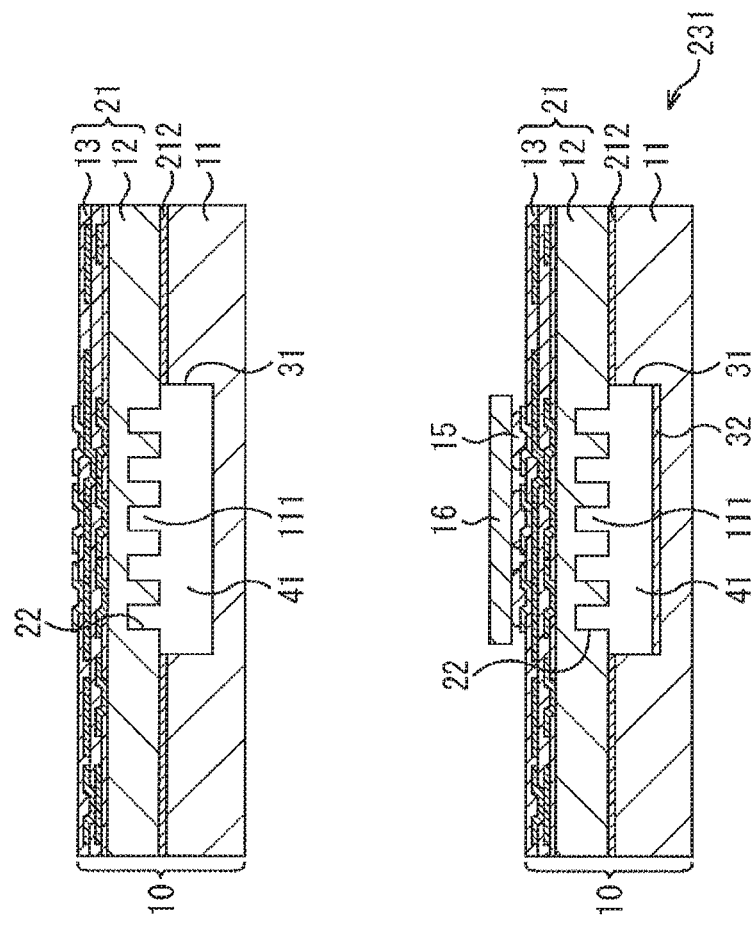

[FIG. 17]
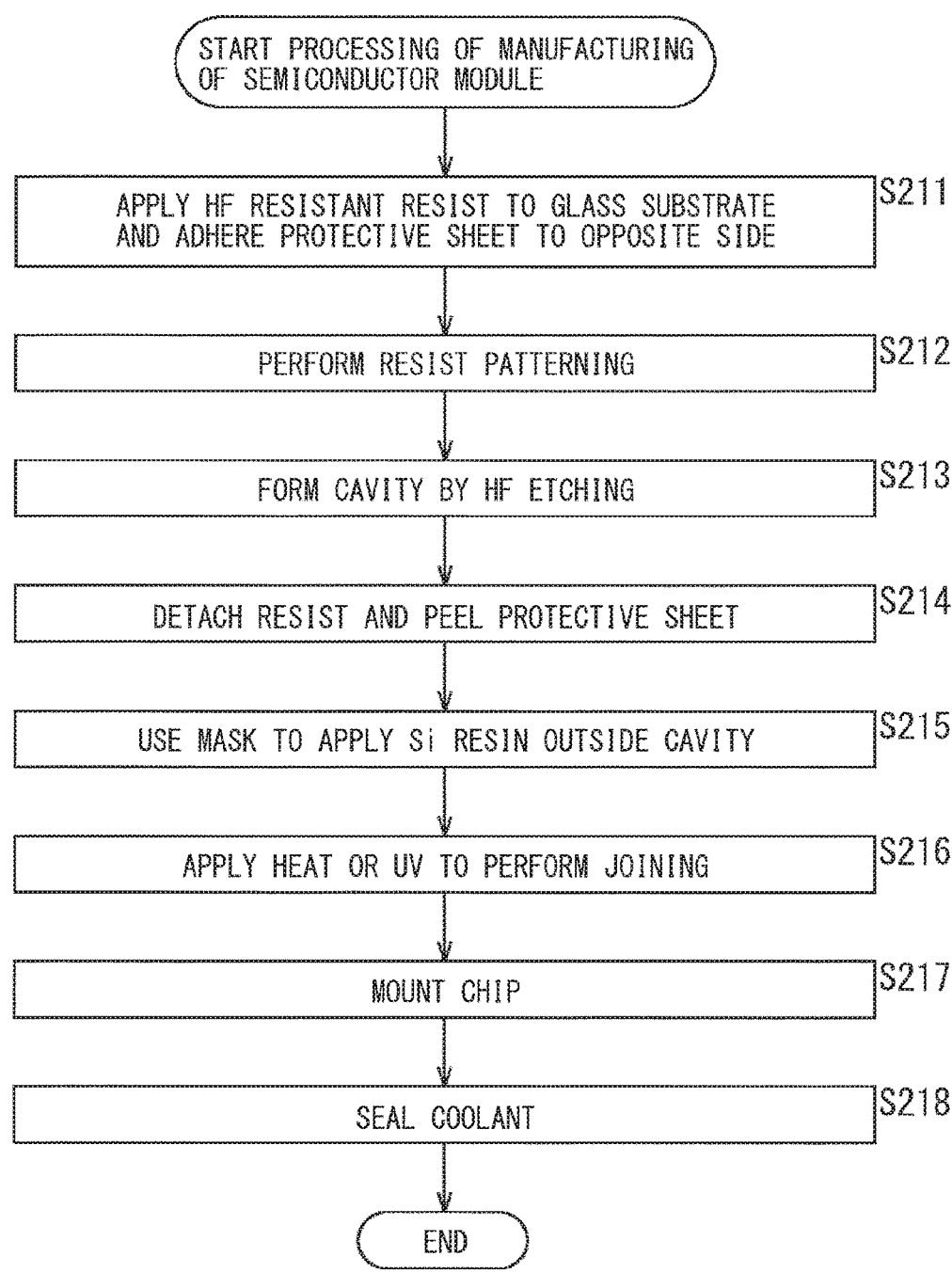

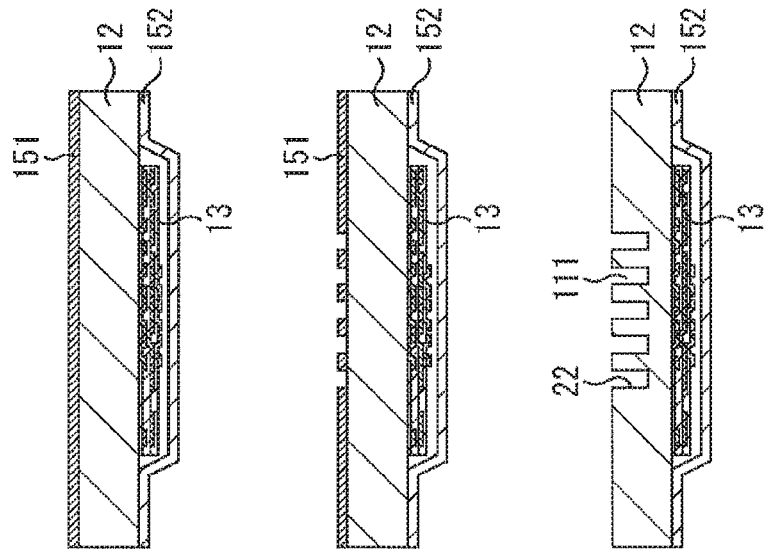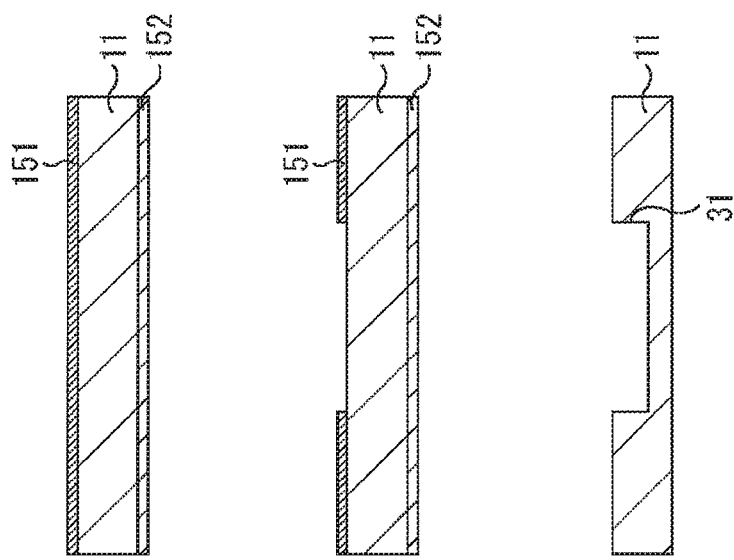

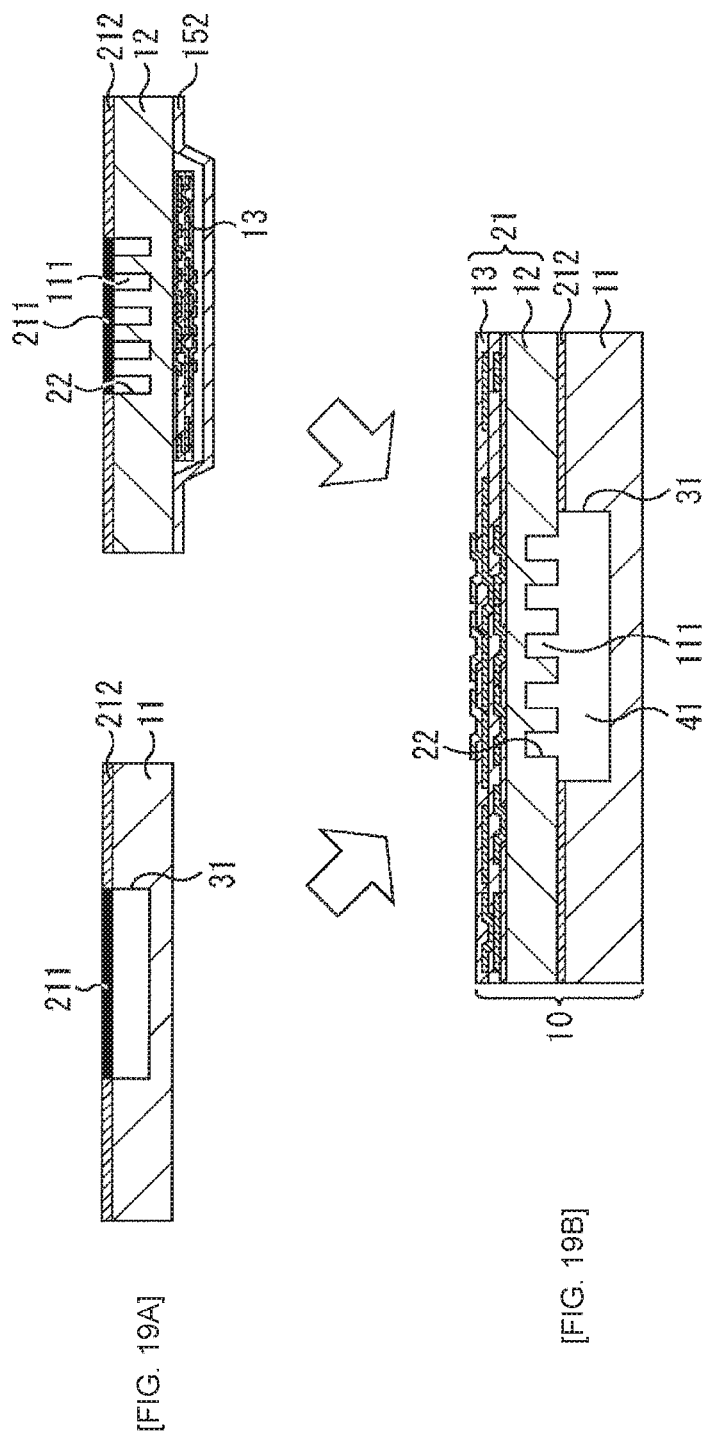

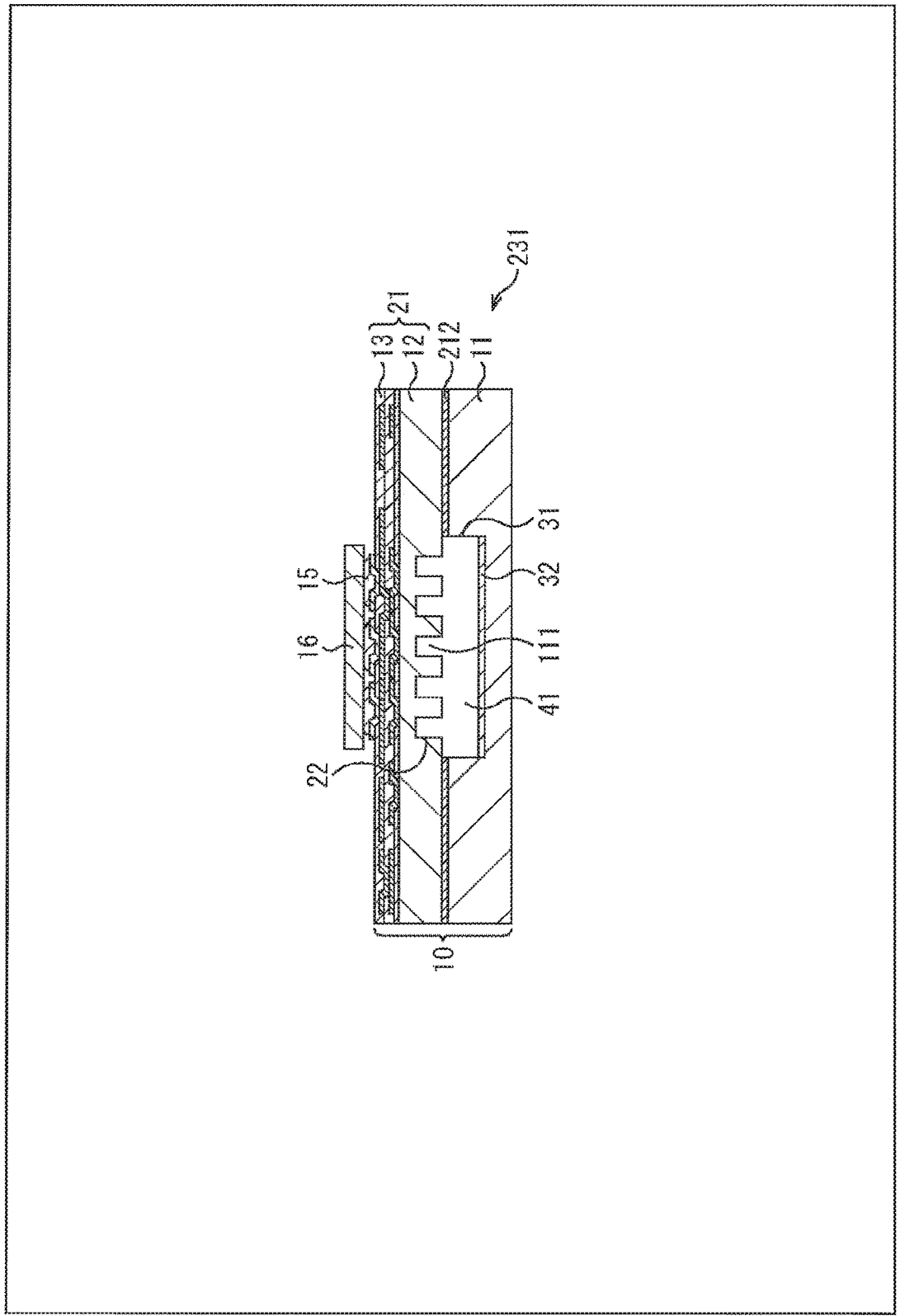
[FIG. 20]

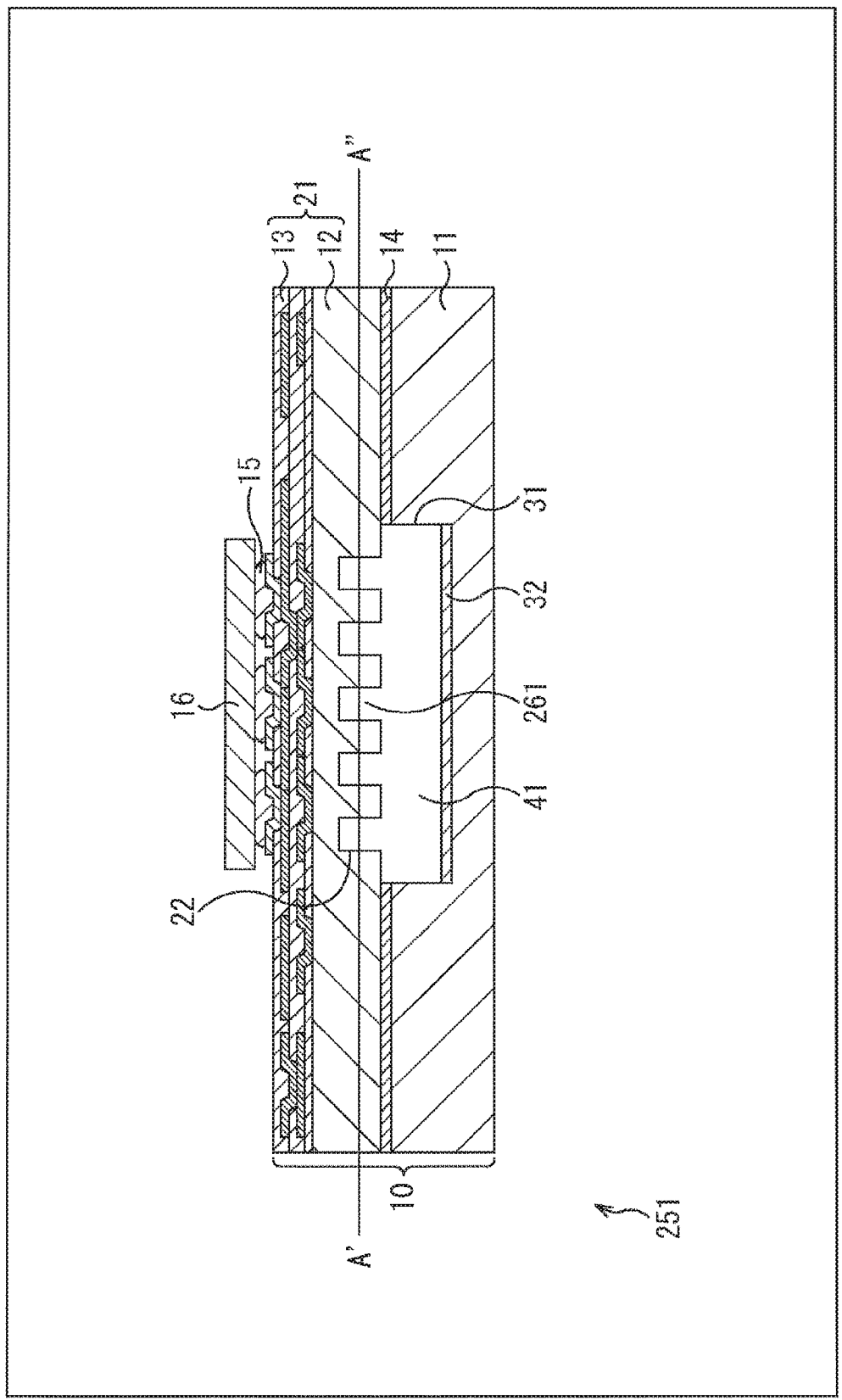
[FIG. 21]

[FIG. 22]
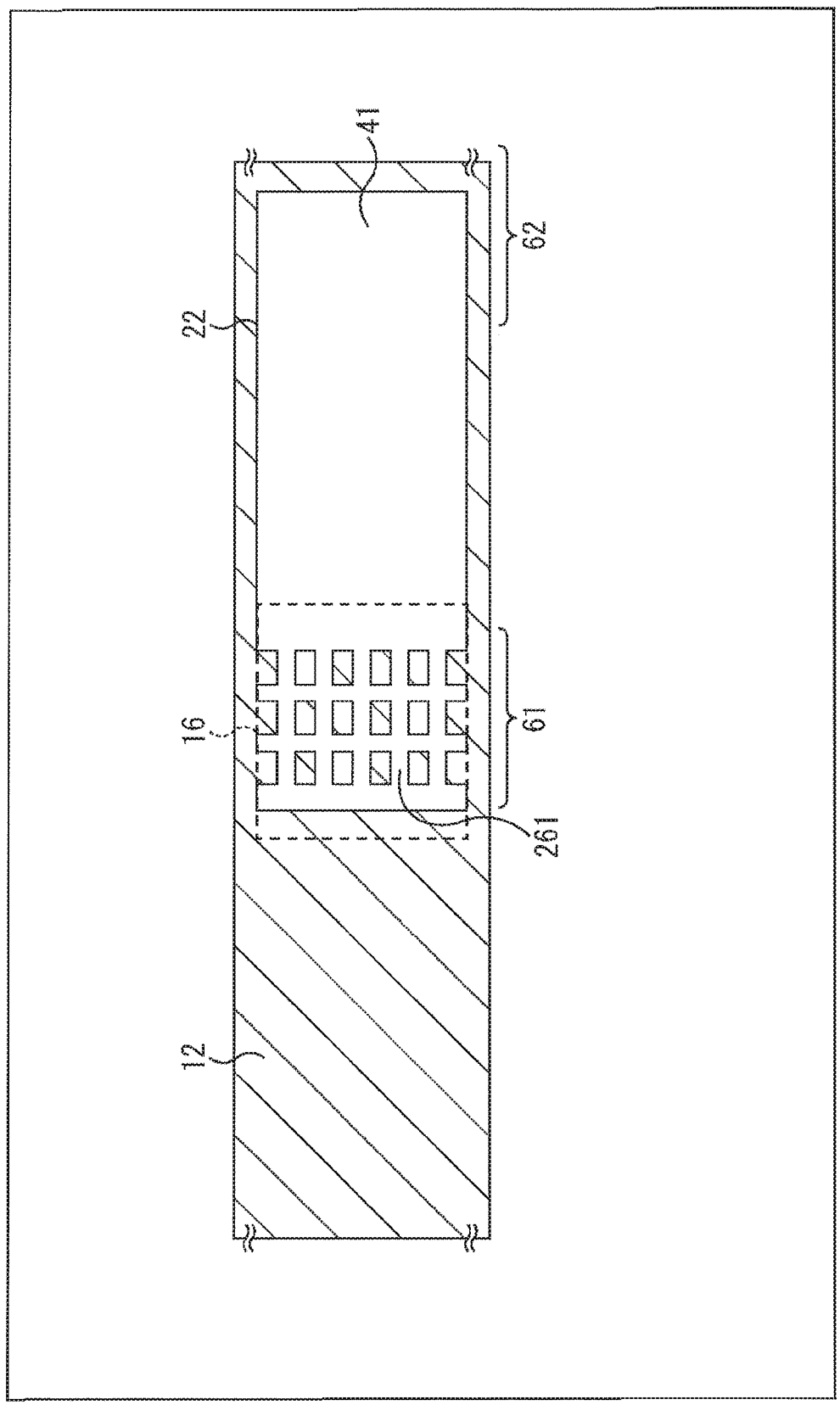

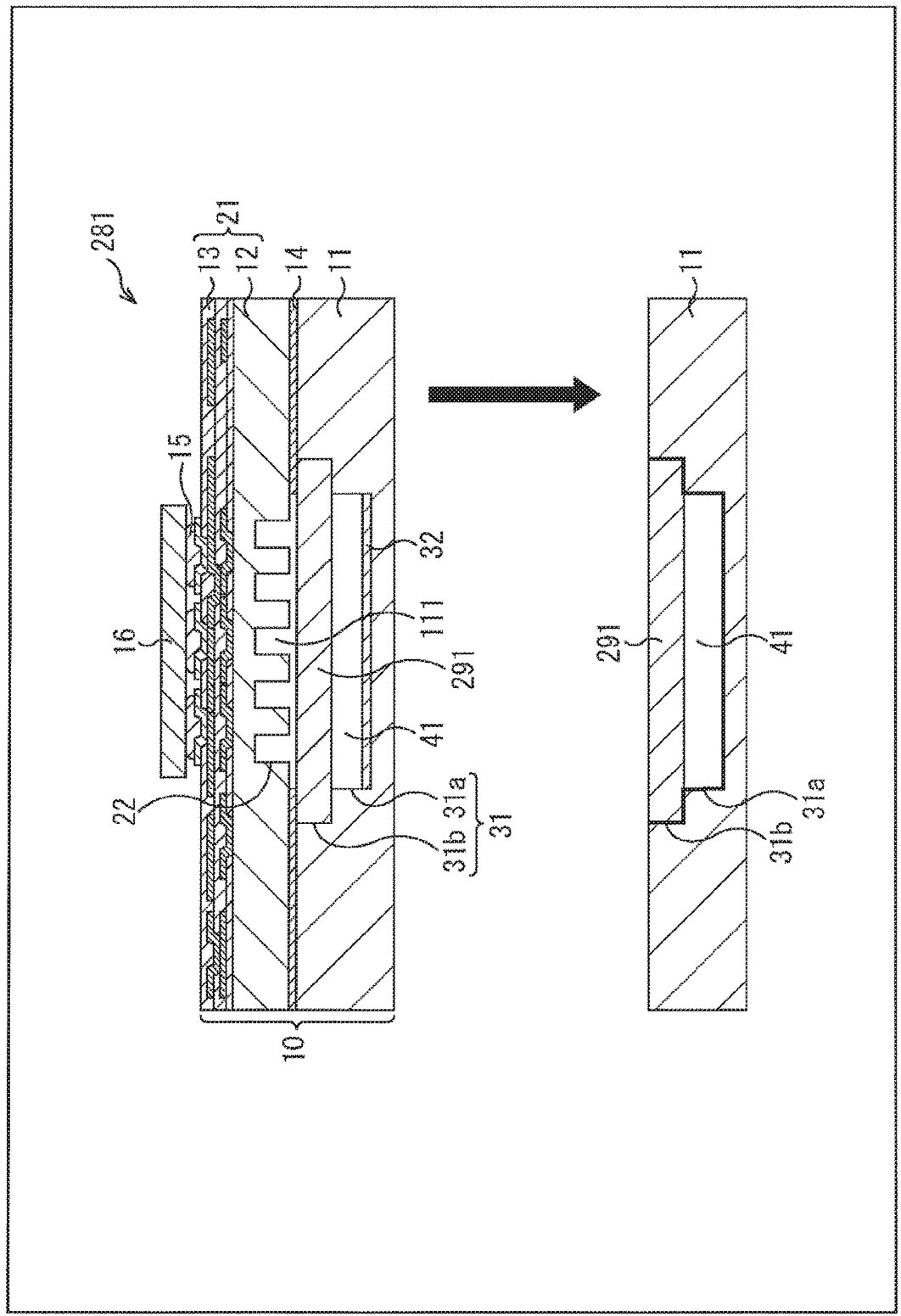
[FIG. 23]

[FIG. 24]
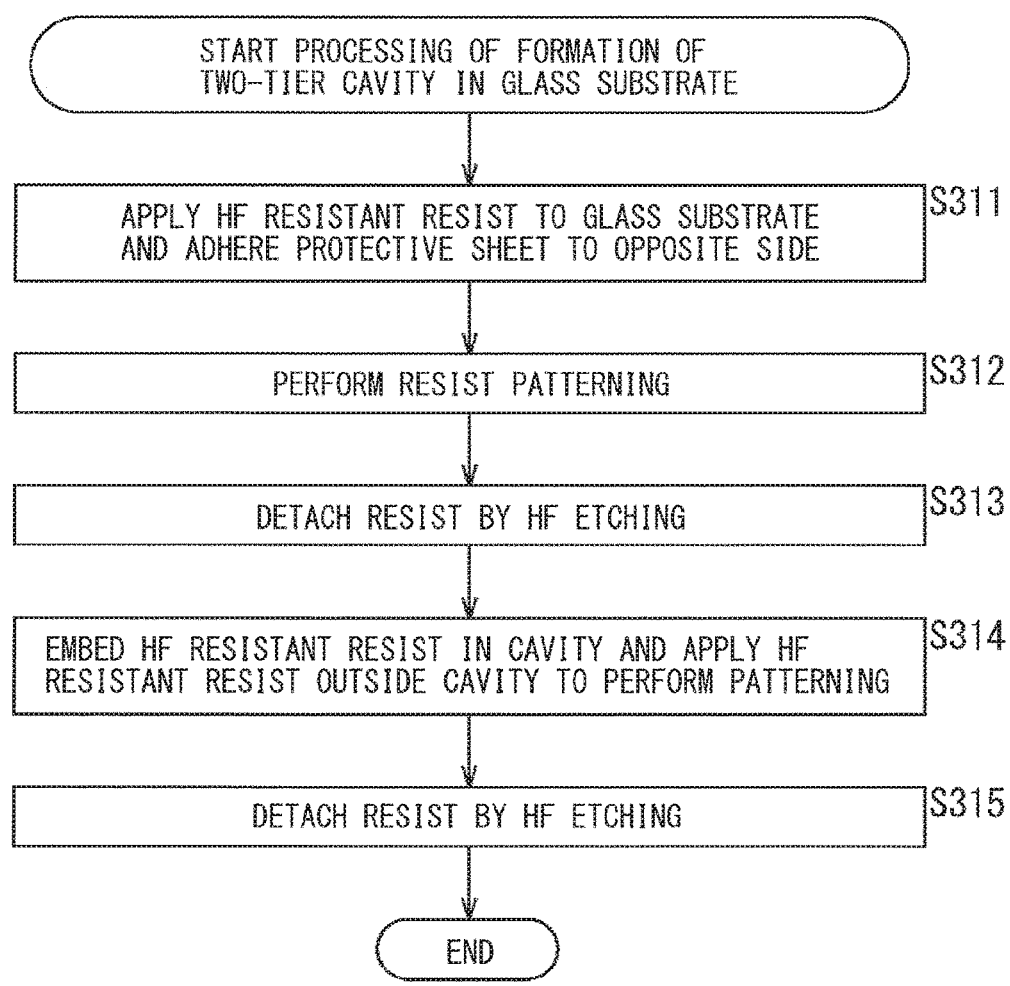

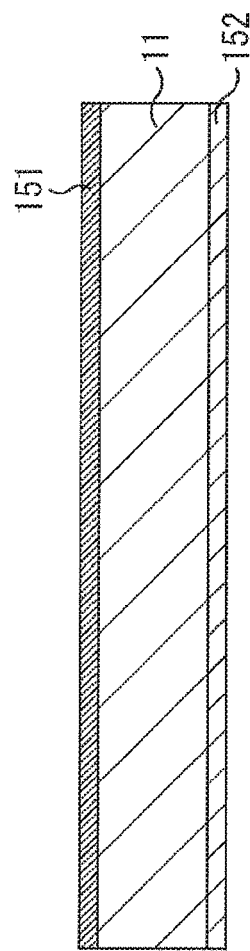
[FIG. 25A]
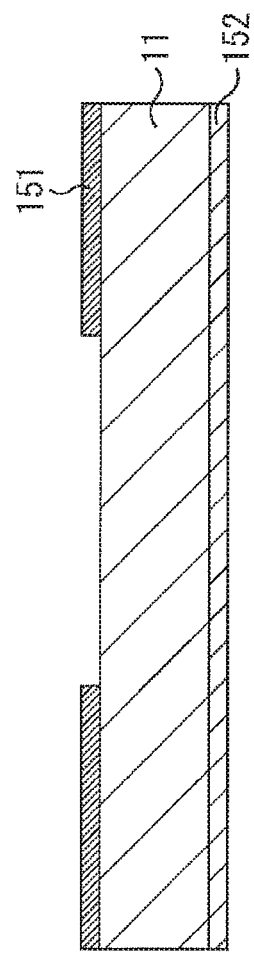
[FIG. 25B]
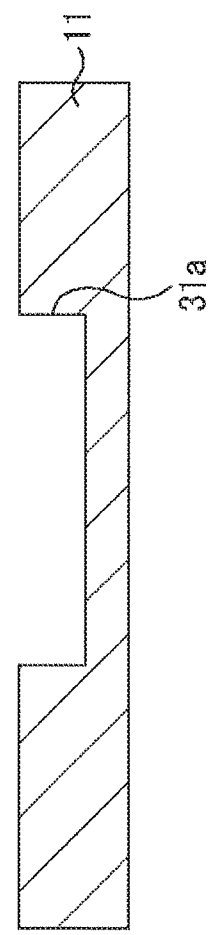
[FIG. 25C]

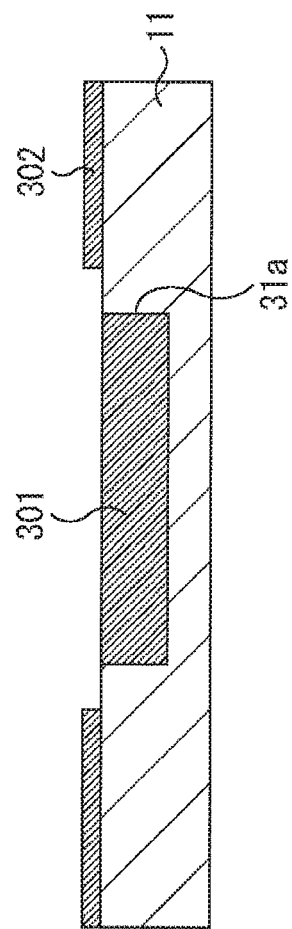
[FIG. 26A]
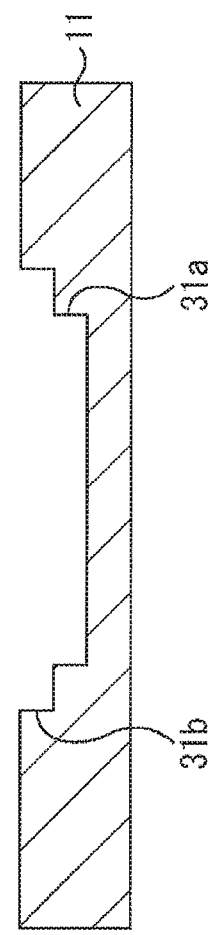
[FIG. 26B]

[FIG. 27]
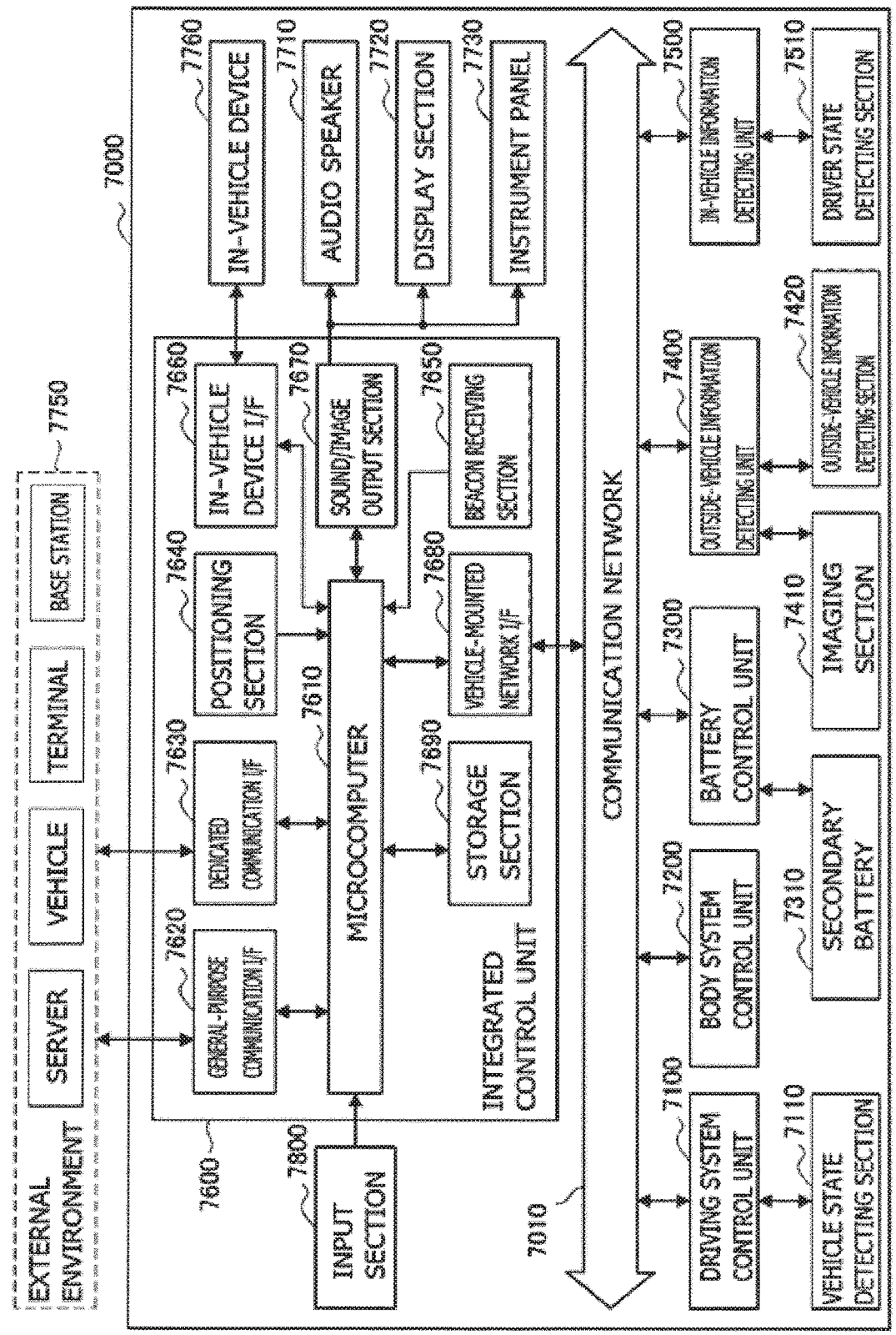

[FIG. 28]
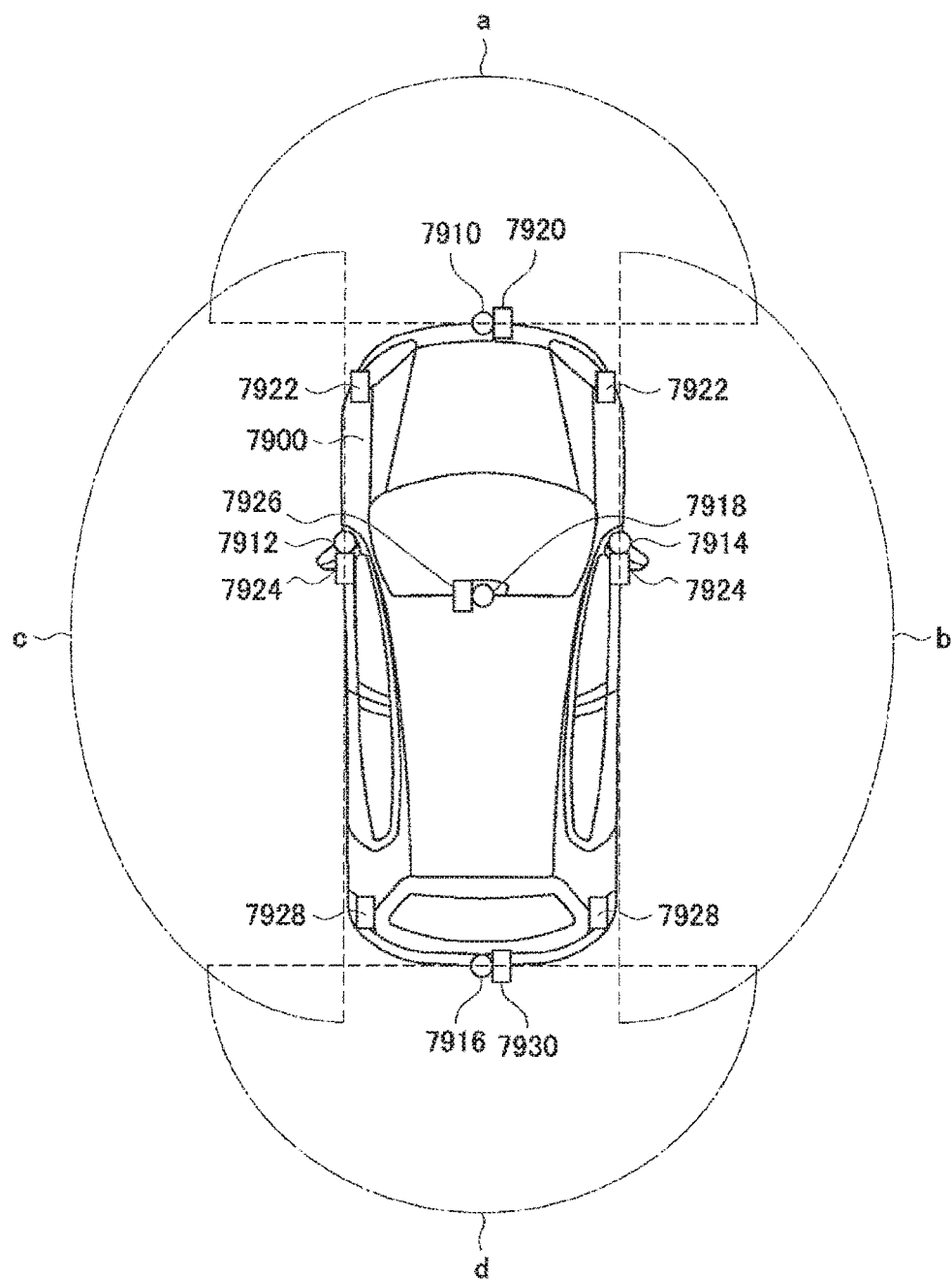

[FIG. 29]
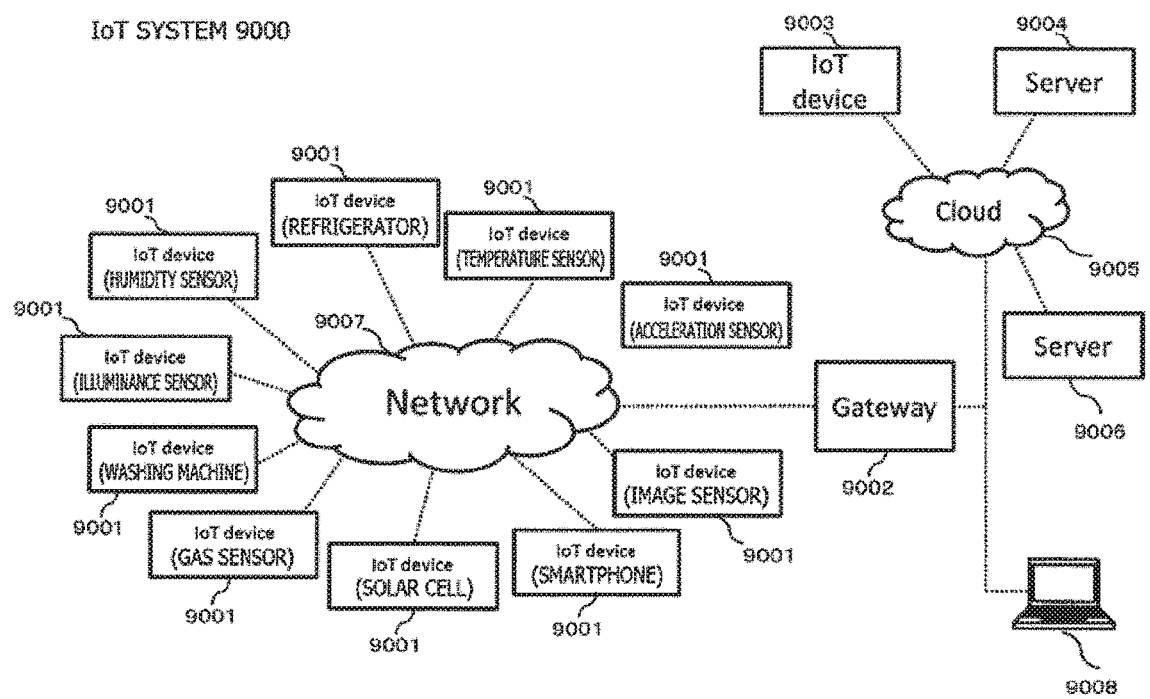

SEMICONDUCTOR DEVICE

CROSS REFERENCE TO RELATED APPLICATIONS

This application is a U.S. National Phase of International Patent Application No. PCT/JP2018/033551 filed on Sep. 11, 2018, which claims priority benefit of Japanese Patent Application No. JP 2017-183931 filed in the Japan Patent Office on Sep. 25, 2017. Each of the above-referenced applications is hereby incorporated herein by reference in its entirety.

TECHNICAL FIELD

The present technology relates to a semiconductor device, and more particularly relates to a semiconductor device that makes it possible to enhance a heat dissipation capacity without occurrence of a fluctuation in high frequency characteristics.

BACKGROUND ART

In currently available techniques of a heat pipe serving as a heat dissipation part for dissipating heat of a substrate, there have been a method of producing a heat pipe within a wiring substrate and a method of attaching a heat pipe to a wiring substrate.

PTL 1 proposes a printed wiring substrate in which two metal plates are adhered together to form a cavity part and in which a heat pipe is incorporated in the cavity part. In the printed wiring substrate, vias and grounds are used to dissipate heat.

It is to be noted that, although PTL 2 describes a method as a method of producing a heat pipe within a glass substrate, the method is not proposed for the wiring substrate.

CITATION LIST

Patent Literature

PTL 1: Japanese Unexamined Patent Application Publication No. 2000-138485
PTL 2: Japanese Unexamined Patent Application Publication No. 2003-185369

SUMMARY OF THE INVENTION

Problems to be Solved by the Invention

As described above, a heat pipe that serves as a heat dissipation part in a wiring substrate has so far been generally produced using a metal material. Hence, when the heat pipe made of metal is applied to a high-frequency module and a high-speed communication module, there has been a concern of a fluctuation in high frequency characteristics of the module, such as a variation in line characteristics or a decrease in antenna sensitivity.

The present technology has been made in view of such circumstances, and makes it possible to enhance a heat dissipation capacity without occurrence of a fluctuation in high frequency characteristics.

Means for Solving the Problems

A semiconductor device according to an aspect of the present technology includes: a wiring layer-attached glass substrate; a glass substrate that is adhered to the wiring layer-attached glass substrate; and a heat dissipation part that is formed between the wiring layer-attached glass substrate and the glass substrate.

In an aspect of the present technology, a glass substrate is adhered to a wiring layer-attached glass substrate, and a heat dissipation part is formed between the wiring layer-attached glass substrate and the glass substrate.

Effects of the Invention

According to the present technology, it is possible to enhance the heat dissipation capacity without occurrence of a fluctuation in the high frequency characteristics.

It is to be noted that the effects described in the present specification are merely illustrative; the effects of the present technology are not limited to the effects described in the present specification, and an additional effect may be provided.

BRIEF DESCRIPTION OF THE DRAWINGS

FIG. 1 is a cross-sectional view of a first configuration example of a semiconductor module to which the present technology is applied.

FIG. 2 is a plan view taken along line A'-A' of FIG. 1.

FIG. 3 is a cross-sectional view of a second configuration example of the semiconductor module to which the present technology is applied.

FIG. 4 is a plan view taken along line A'-A' of FIG. 3.

FIG. 5 is a flowchart describing processing of manufacturing of the semiconductor module of FIG. 3.

FIGS. 6A, 6B, and 6C are a are process diagrams describing processing of manufacturing of the semiconductor module of FIG. 5.

FIGS. 7A and 7B are process diagrams that follows FIGS. 6A, 6B, and 6C and that describes processing of manufacturing of the semiconductor module of FIG. 5.

FIGS. 8A, 8B, and 8C are process diagrams that follows FIGS. 7A and 7B and that describes processing of manufacturing of the semiconductor module of FIG. 5.

FIGS. 9A and 9B describes a method of sealing a coolant.

FIGS. 10A and 10B describes another method of sealing the coolant.

FIG. 11 is a cross-sectional view of a configuration example of a semiconductor module in which a coolant-sealing groove is formed.

FIG. 12 illustrates a plan taken along line A'-A" of FIG. 11 and a cross-section taken along line B'-B" thereof.

FIG. 13 is a flowchart describing processing of manufacturing of a semiconductor module of a third configuration.

FIGS. 14A, 14B, and 14C are process diagrams describing processing of manufacturing of the semiconductor module of FIG. 13.

FIGS. 15A and 15B are process diagrams that follows FIGS. 14A, 14B, and 14C and that describes processing of manufacturing of the semiconductor module of FIG. 13.

FIGS. 16A and 16B are process diagrams that follows FIGS. 15A and 15B and that describes processing of manufacturing of the semiconductor module of FIG. 13.

FIG. 17 is a flowchart describing another processing of manufacturing of the semiconductor module of the third configuration.

FIGS. 18A, 18B, and 18C are process diagrams describing processing of manufacturing of the semiconductor module of FIG. 17.

FIGS. 19A and 19B are process diagrams that follows FIGS. 18A, 18B, and 18C and that describes processing of manufacturing of the semiconductor module of FIG. 17.

FIG. 20 is a process diagram that follows FIGS. 19A and 19B and that describes processing of manufacturing of the semiconductor module of FIG. 17.

FIG. 21 is a cross-sectional view of a fourth configuration example of the semiconductor module to which the present technology is applied.

FIG. 22 is a plan view taken along line A'-A" of FIG. 21.

FIG. 23 is a cross-sectional view of a fifth configuration example of the semiconductor module to which the present technology is applied.

FIG. 24 is a flowchart describing processing of formation of a two-tier cavity in a glass substrate of the semiconductor module of FIG. 23.

FIGS. 25A, 25B, and 25C are process diagrams describing processing of formation of the two-tier cavity in the glass substrate of FIG. 24.

FIGS. 26A and 26B are process diagrams that follows FIGS. 25A, 25B, and 25C and that describes processing of formation of the two-tier cavity in the glass substrate of FIG. 24.

FIG. 27 is a block diagram depicting an example of schematic configuration of a vehicle control system.

FIG. 28 is a diagram of assistance in explaining an example of installation positions of an outside-vehicle information detecting section and an imaging section.

FIG. 29 is a diagram illustrating an example of a schematic configuration of an IoT system.

MODES FOR CARRYING OUT THE INVENTION

Modes for carrying out the present disclosure (hereinafter referred to as the embodiment) are described below. The description is given in the following order.

1. First Embodiment
2. Second Embodiment
3. Third Embodiment
4. Fourth Embodiment
5. Fifth Embodiment
6. Application Example 1
7. Application Example 2

First Embodiment

<Configuration Example of Semiconductor Module>

FIG. 1 is a cross-sectional view of a first configuration example of a semiconductor module to which the present technology is applied.

In the semiconductor module 1 of FIG. 1, a semiconductor chip 16 is mounted on a glass wiring substrate 10 with bumps 15 being interposed therebetween. The glass wiring substrate 10 is configured by adhering together a glass substrate 11 and a glass substrate 12 having a wiring layer 13 using an inorganic film 14. The wiring layer 13 is formed in the surface of the semiconductor module 1 and is electrically coupled to the semiconductor chip 16 through the bumps 15.

In the glass substrate 11, a cavity (recessed part) 31 is formed substantially immediately below the semiconductor chip 16.

In the glass substrate 12, a cavity 22 is formed to face the cavity 31 on side opposite to the wiring layer 13 when adhered to the glass substrate 12. The glass substrate 12 on which the wiring layer 13 is formed is also referred to as a wiring layer-attached glass substrate 21. The thickness of the wiring layer-attached glass substrate 21 is substantially equal to the thickness of the glass substrate 11.

The depth of the cavity 31 in the glass substrate 11 is substantially equal to the depth of the cavity 22 in the glass substrate 12.

In the semiconductor module 1, a cavity space that includes the cavity 22 and the cavity 31 functions as a heat dissipation part that dissipates heat generated by the semiconductor chip 16, i.e., as a heat pipe 41. A coolant 32 is sealed in the cavity 31 of the cavity space. The cavity 22 of the glass substrate 12 functions as an evaporation layer of the heat pipe 41. The cavity 31 of the glass substrate 11 functions as a fluid layer of the heat pipe 41.

In other words, the cavity space formed between the wiring layer-attached glass substrate 21 and the glass substrate 11 is provided immediately below the semiconductor chip 16, and the coolant 32 is sealed therein, to cause the cavity space to function as the heat pipe 41. Accordingly, the distance between the semiconductor chip 16 serving as a heat source and the cavity space is reduced, thus making it possible to enhance a heat dissipation capacity. In this way, it is possible to suppress an influence on high frequency characteristics.

FIG. 2 is a plan view taken along line A'-A" of FIG. 1. The leftward direction in FIG. 2 corresponds to the frontward direction of the semiconductor module 1 of FIG. 1. It is to be noted that, in FIG. 2, the length of a vertical part of the glass substrate 12 is omitted for convenience of description.

In the semiconductor module 1, the semiconductor chip 16 having a substantially square shape is mounted in a position indicated by broken lines. Although the sizes of the semiconductor chip 16 and the cavity 22 are illustrated to be substantially equal to each other, the size of the cavity 22 may be larger. Immediately below the semiconductor chip 16, an evaporation part 61 of the heat pipe 41 is provided that is the cavity space including the cavity 22 and the cavity 31. In addition, on right side (rear in FIG. 1) with respect to a position immediately below the semiconductor chip 16 indicated by the broken lines, there is provided a condensation part 62 of the heat pipe 41. In other words, the heat pipe 41 is formed horizontally long in the semiconductor module 1. In addition, when the semiconductor chip 16 is located in the middle of the semiconductor module 1, the heat pipe 41 is displaced to the right side in the figure and is formed with a narrow room left on the right side. It is to be noted that the shape of the heat pipe 41 may be formed to be square or does not necessarily need to be horizontally long.

The coolant 32 (FIG. 1) sealed in the cavity space is circulated through the evaporation part 61 and the condensation part 62 of the heat pipe 41, thereby making it possible to efficiently dissipate heat generated in the semiconductor chip 16 mounted immediately thereabove.

Second Embodiment

<Configuration Example of Semiconductor Module>

FIG. 3 is a cross-sectional view of a second configuration example of the semiconductor module to which the present technology is applied. It is to be noted that, in FIG. 3, parts corresponding to those of the case illustrated in FIG. 1 are denoted with the same reference numerals, and the description thereof is omitted where appropriate. The same is true also in subsequent drawings.

In the semiconductor module 101 of FIG. 3, grooves 111 are provided within the cavity 22 of the glass substrate 12, which functions as the evaporation layer of the heat pipe 41. In the grooves 111, five grooves are aligned parallel to one another from the front to back side of the figure. It is to be noted that the number of grooves is not limited to five, and any number thereof may be adopted.

FIG. 4 is a plan view taken along line A'-A" of FIG. 3. The leftward direction in FIG. 4 is the frontward direction of the semiconductor module 101 of FIG. 3. It is to be noted that, in FIG. 4, parts corresponding to those of the case in FIG. 2 are denoted with the same reference numerals, and the description thereof is omitted where appropriate. The same is true also in subsequent drawings.

In the semiconductor module 101, the grooves 111 provided immediately below the semiconductor chip 16 are formed in a slit structure as a portion of the evaporation layer of the heat pipe 41 that is the cavity space including the cavity 22 and the cavity 31. In the grooves 111, the five grooves whose thicknesses are substantially equal to one another are formed horizontally long in a right-left direction.

As described above, the grooves 111 having the slit structure and serving as the evaporation layer of the heat pipe 41 are provided within the glass wiring substrate 10, thereby increasing the surface area of the heat pipe 41, thus making it possible to enhance the heat dissipation capacity for heat generated in the semiconductor module 101.

<Method of Manufacturing Semiconductor Module>

Next, processing of manufacturing of the semiconductor module 101 of FIG. 3 is described with reference to a flowchart of FIG. 5. Description is given of the processing of manufacturing using, as a subject, a manufacturing apparatus that performs the processing of manufacturing of the semiconductor module 101. In the description, the process diagrams of FIGS. 6A, 6B, 6C, 7A, 7B, 8A, 8B, and 8C are referred to where appropriate.

In step S11, the manufacturing apparatus applies an HF resistant resist 151 to each of the glass substrate 11 and the glass substrate 12, and a protective sheet 152 is adhered to each of sides, of the glass substrate 11 and the glass substrate 12, opposite to application sides of the HF resistant resist 151 (see FIG. 6A).

The glass substrate 11 and the glass substrate 12 are 400 um thick glass substrates. The HF resistant resist 151 is applied to have a thickness of about 70 um.

In step S12, the manufacturing apparatus performs resist patterning by UV exposure on the glass substrate 11 and the glass substrate 12 (see FIG. 6B).

In step S13, the manufacturing apparatus respectively forms the cavity 31 and the cavity 22 by HF etching in the glass substrate 11 and the glass substrate 12 that have been subjected to the resist patterning (see FIG. 6C).

The cavity 31 and the cavity 22 are formed to have a depth of 100 um to 200 um. At that time, the grooves 111 having the slit structure are also formed in the cavity 22.

In step S14, after the formation of the cavity 31 and the cavity 22, the manufacturing apparatus detaches the HF resistant resist 151 and peels the protective sheet 152 from the glass substrate 11 and the glass substrate 12.

In step S15, the manufacturing apparatus uses a mask 161 to form the inorganic film 14 on each of the outside of the cavity 31 in the glass substrate 11 and the outside of the cavity 22 in the glass substrate 12. After the formation of the inorganic film 14, sputtering is used to uniformly form the inorganic film 14 (see FIG. 7A).

In step S16, the manufacturing apparatus performs heating with a heater, and joins together the glass substrate 11 and the glass substrate 12 by anodic bonding to allow the cavity 31 and the cavity 22 to face each other. The inorganic film 14 is a Si (silicon) thin film or an Al (aluminum) thin film (see FIG. 7B).

In a case where the inorganic film 14 is the Si thin film, as the condition of the anodic bonding, the manufacturing apparatus heats the heater to about 400 degrees and applies a voltage of several hundreds of volts to perform the joining. In a case where the inorganic film 14 is the Al thin film, it is possible to perform the anodic bonding at about 200 degrees. At that time, the manufacturing apparatus sandwiches, with electrodes, the upper parts and the lower parts of the glass substrate 11 and the glass substrate 12 adhered together to apply the voltage.

In step S17, the manufacturing apparatus forms the wiring layer 13 on side of the glass substrate 12 having the cavity 22 where the grooves 111 are formed, out of the glass substrate 11 and the glass substrate 12 joined together (see A of FIG. 8).

In step S17, the manufacturing apparatus forms the wiring layer 13 on side of the glass substrate 12 having the cavity 22 where the grooves 111 are formed, out of the glass substrate 11 and the glass substrate 12 joined together (see FIG. 8A).

In step S18, the manufacturing apparatus mounts the semiconductor chip 16 on the formed wiring layer 13 with the bumps 15 being interposed therebetween (see FIG. 8B).

In step S19, the manufacturing apparatus seals the coolant 32 in the glass wiring substrate 10 on which the semiconductor chip 16 is formed. The coolant 32 is sealed in the cavity space that includes the cavity 22 and the cavity 31 and that functions as the heat pipe (heat dissipation part) 41. The details of a method of sealing the coolant 32 are described later with reference to FIGS. 9A and 9B.

In this way, the processing of manufacturing of the semiconductor module 101 is finished, and thus the semiconductor module 101 is completed that has, immediately below the semiconductor chip 16, the cavity space which functions as the heat pipe 41 (see FIG. 8C).

<Method of Sealing Coolant in Cavity Space>

Next, the method of sealing the coolant in step S19 of FIG. 5 is described with reference to FIGS. 9A, 9B, 10A, and 10B. FIGS. 9A, 9B, 10A, and 10B are each a cross-sectional view taken along line B'-B" of FIG. 3. In other words, FIGS. 9A, 9B, 10A, and 10B are each a cross-sectional view, as viewed from right side, of the semiconductor module 101 of FIG. 3. The cavity 22 and the cavity 31 are actually formed long toward right side (back of FIG. 3).

Specifically, when the cavity 22 and the cavity 31 are formed by the HF etching in step S13 of FIG. 5, the manufacturing apparatus forms, as illustrated in FIG. 9A, a coolant-sealing groove 201 that is continued from the back (right side in FIGS. 9A and 9B) of the glass substrate 12 to the cavity 22.

In step S19 of FIG. 5, the coolant 32 is sealed, through the coolant-sealing groove 201, in the cavity space that functions as the heat pipe 41.

The groove 201 is covered with a metal film produced by sputtering, and thus a tip end of the groove 201 is sealed with a solder 202 or the like after the sealing of the coolant as illustrated in FIG. 9B.

In addition, as illustrated in FIG. 10A, in order to seal the coolant 32, a copper pipe 211 may be inserted in advance into the coolant-sealing groove 201 when the glass substrate 11 and the glass substrate 12 are joined together in step S16 of FIG. 5.

In this case, in step S19 of FIG. 5, the coolant 32 is sealed, through the copper pipe 211, in the cavity space that functions as the heat pipe 41. The coolant 32 is water, alcohol, or an alternative for chlorofluorocarbon.

After the sealing of the coolant, similarly to the case where the groove 201 is used, the tip end of the copper pipe 211 may be sealed with a solder 212 or the like as illustrated in FIG. 10B.

FIG. 11 is a cross-sectional view of the semiconductor module 101 in which the coolant-sealing groove 201 is formed taken along a plane parallel to the front surface of the semiconductor module 101 to allow a cross section of the grooves 111 in the cavity 22 be seen. Although not illustrated in FIG. 11, the coolant-sealing groove 201 is formed at the back of the semiconductor module 101 in the figure.

FIG. 12 illustrates a configuration example of the semiconductor module as viewed in directions of observation indicated by an arrow 1 and an arrow 2 of FIG. 11.

In the upper part of FIG. 12, a plane surface is illustrated that is taken along line A'-A" as viewed in the direction of observation indicated by the arrow 1 (upper side of FIG. 11). In the lower part of FIG. 12, a cross section is illustrated that is taken along line B'-B" as viewed in the direction of observation indicated by the arrow 2 (right side of FIG. 11).

In the evaporation part 61 of the heat pipe 41 in the cavity 22 of FIG. 12, the grooves 111 having the slit structure are illustrated. In addition, on right side of the condensation part 62 of the heat pipe 41 in the cavity 22 of FIG. 12, the coolant-sealing groove 201 is illustrated that is continued from right side (back in FIG. 11) of the glass substrate 12 to the cavity 22.

It is to be noted that, although the example where the glass substrate 11 and the glass substrate 12 are joined together by the inorganic film 14 is described above, as is subsequently described with reference to FIG. 13, the glass substrate 11 and the glass substrate 12 may be joined together by a resin.

Third Embodiment

<Method of Manufacturing Semiconductor Module>

FIG. 13 is a flowchart describing processing of manufacturing of a semiconductor module 231 (FIG. 16 described later) of a third configuration in which the glass substrate 11 and the glass substrate 12 are joined together by a resin. Description is given of the processing of manufacturing using, as a subject, a manufacturing apparatus that performs processing of manufacturing of the semiconductor module. In the description, process diagrams of FIG. 14 to FIG. 16 are referred to where appropriate.

In step S111, the manufacturing apparatus applies the HF resistant resist 151 to each of the glass substrate 11 and the glass substrate 12, and the protective sheet 152 is adhered to each of the sides, of the glass substrate 11 and the glass substrate 12, opposite to the application sides of the HF resistant resist 151 (see A of FIG. 14).

In step S112, the manufacturing apparatus performs resist patterning by UV exposure on the glass substrate 11 and the glass substrate 12 (see B of FIG. 14).

FIG. 13 is a flowchart describing processing of manufacturing of a semiconductor module 231 (FIGS. 16A and 16B described later) of a third configuration in which the glass substrate 11 and the glass substrate 12 are joined together by a resin. Description is given of the processing of manufacturing using, as a subject, a manufacturing apparatus that performs processing of manufacturing of the semiconductor module. In the description, process diagrams of FIGS. 14A, 14B, 14C 15A 15B 16A and 16B are referred to where appropriate.

In step S111, the manufacturing apparatus applies the HF resistant resist 151 to each of the glass substrate 11 and the glass substrate 12, and the protective sheet 152 is adhered to each of the sides, of the glass substrate 11 and the glass substrate 12, opposite to the application sides of the HF resistant resist 151 (see FIG. 14A).

In step S112, the manufacturing apparatus performs resist patterning by UV exposure on the glass substrate 11 and the glass substrate 12 (see FIG. 14B).

In step S113, the manufacturing apparatus respectively forms the cavity 31 and the cavity 22 by HF etching in the glass substrate 11 and the glass substrate 12 that have been subjected to the resist patterning (see FIG. 14C).

In step S114, after the formation of the cavity 31 and the cavity 22, the manufacturing apparatus detaches the HF resistant resist 151 and peels the protective sheet 152 from the glass substrate 11 and the glass substrate 12.

In step S115, the manufacturing apparatus uses a mask 221 to apply a resin 222 to each of the outside of the cavity 31 in the glass substrate 11 and the outside of the cavity 22 in the glass substrate 12 (see FIG. 15A). As the resin 222, a thermosetting resin or a UV curable resin is used.

In step S116, the manufacturing apparatus applies heat or UV, and joins together the glass substrate 11 and the glass substrate 12 to allow the cavity 31 and the cavity 22 to face each other (see FIG. 15B).

In step S117, the manufacturing apparatus forms the wiring layer 13 on the side of the glass substrate 12 having the cavity 22 where the grooves 111 are formed, out of the glass substrate 11 and the glass substrate 12 joined together (see FIG. 16A).

In step S118, the manufacturing apparatus mounts the semiconductor chip 16 on the formed wiring layer 13 with the bumps 15 being interposed therebetween.

In step S119, the manufacturing apparatus seals the coolant 32 in the cavity space that functions as the heat pipe (heat dissipation part) 41 of the glass wiring substrate 10 on which the semiconductor chip 16 is formed. This allows the semiconductor module 231 to be manufactured (see FIG. 16B).

In this way, the processing of manufacturing of the semiconductor module 231 is finished, and thus the semiconductor module 231 is completed that has, immediately below the semiconductor chip 16, the cavity space which functions as the heat pipe 41.

Description has been given, in processing of manufacturing of FIG. 5 and FIG. 13, of the example where the glass substrate 11 and the glass substrate 12 are joined together and then the wiring layer 13 is formed. Unlike the case of the inorganic film 14, in the case of the resin 222, it is not necessary to apply high-temperature heat to the joining of the glass substrate 11 and the glass substrate 12. Therefore, as is subsequently described, the wiring layer 13 may be formed in advance on the glass substrate 11, and the glass substrate 11 on which the wiring layer 13 is formed and the glass substrate 12 may be joined together.

<Another Method of Manufacturing Semiconductor Module>

FIG. 17 is a flowchart describing processing of manufacturing of the semiconductor module 231 in which the glass substrate 11 on which the wiring layer 13 is formed and the glass substrate 12 are joined together by the resin 222. Description is given of the processing of manufacturing using, as a subject, a manufacturing apparatus that performs processing of manufacturing of the semiconductor module. In the description, the process diagrams of FIGS. 18A, 18B, 18C, 19A, and 19B are referred to where appropriate.

In step S211, the manufacturing apparatus applies the HF resistant resist 151 to the glass substrate 11, and the protective sheet 152 is adhered to side opposite to application side of the HF resistant resist 151. In addition, the manufacturing apparatus covers the wiring layer 13 of the glass substrate 12 with the protective sheet 152, and applies the HF resistant resist 151 to side opposite to the side on which the wiring layer 13 is formed (see FIG. 18A).

In step S212, the manufacturing apparatus performs resist patterning by UV exposure on the glass substrate 11 and the glass substrate 12 (see FIG. 18B).

In step S213, the manufacturing apparatus respectively forms the cavity 31 and the cavity 22 by HF etching in the glass substrate 11 and the glass substrate 12 that have been subjected to the resist patterning (see FIG. 18C).

In step S214, after the formation of the cavity 31 and the cavity 22, the manufacturing apparatus detaches the HF resistant resist 151 from the glass substrate 11 and the glass substrate 12 and peels the protective sheet 152 from the glass substrate 12. The protective sheet 152 that covers the wiring layer 13 has not been peeled yet.

In step S215, the manufacturing apparatus uses the mask 221 to apply the resin 222 to each of the outside of the cavity 31 in the glass substrate 11 and the outside of the cavity 22 in the glass substrate 12 (see FIG. 19A).

In step S216, the manufacturing apparatus applies heat or UV, and joins together the glass substrate 11 and the glass substrate 12 to allow the cavity 31 and the cavity 22 to face each other (see FIG. 19B). After the joining, the protective sheet 152 that covers the wiring layer 13 of the glass substrate 12 is peeled.

In step S217, the manufacturing apparatus mounts the semiconductor chip 16 on the wiring layer 13 formed on the glass substrate 12, with the bumps 15 being interposed therebetween (see FIG. 20).

In step S218, the manufacturing apparatus seals the coolant 32 in the cavity space that functions as the heat pipe (heat dissipation part) 41 of the glass wiring substrate 10 on which the semiconductor chip 16 is formed.

In this way, the processing of manufacturing of the semiconductor module 231 is finished, and thus the semiconductor module 231 is completed that has, immediately below the semiconductor chip 16, the cavity space which functions as the heat pipe 41.

Fourth Embodiment

<Configuration Example of Semiconductor Module>

FIG. 21 is a cross-sectional view of a fourth configuration example of the semiconductor module to which the present technology is applied.

In a semiconductor module 251 of FIG. 21, grooves 261 are provided within the cavity 22 of the glass substrate 12, which functions as the evaporation layer of the heat pipe 41. In the grooves 261, five grooves whose thicknesses are substantially equal to one another are formed horizontally long. In the grooves 261, the five grooves are aligned parallel to each other from the front to back side of the figure. It is to be noted that the number of grooves is not limited to five, and any number thereof may be adopted.

FIG. 22 is a plan view taken along line A'-A" of FIG. 21. The leftward direction in FIG. 22 is the frontward direction of the semiconductor module 251 of FIG. 21.

In the cavity space that includes the cavity 22 and the cavity 31, the grooves 261 provided immediately below the semiconductor chip 16 are formed in a lattice structure as a portion of the evaporation layer of the heat pipe 41. In the grooves 261, five grooves whose thicknesses are substantially equal to one another are formed horizontally long in the right-left direction, and two grooves whose thicknesses are substantially equal to each other are formed vertically long in an up-down direction. It is to be noted that the number of grooves is not limited to five in the right-left direction and two in the up-down direction, and any number thereof may be adopted.

As described above, within the glass wiring substrate 10, providing the grooves 261 that serve as the evaporation layer of the heat pipe 41 and that have the lattice structure causes the surface area of the heat pipe 41 to be increased as compared with the case of the grooves 111 in the slit structure in FIG. 3, thus making it possible to enhance the heat dissipation capacity for heat generated in the semiconductor module 251.

Fifth Embodiment

<Configuration Example of Semiconductor Module>

FIG. 23 is a cross-sectional view of a fifth configuration example of the semiconductor module to which the present technology is applied.

In a semiconductor module 281 of FIG. 23, the cavity 31, of the glass substrate 11, that functions as the evaporation layer of the heat pipe 41 is formed by two tiers of a cavity lower tier 31a and a cavity upper tier 31b, and a porous layer 291 is provided in the cavity upper tier 31b.

The cavity lower tier 31a is narrower in width (lateral length) than the cavity upper tier 31b, and thus the cavity 31 is formed in a downwardly raised shape.

Heat dissipation is performed by transmitting heat to the porous layer 291 using the grooves 111 in the slit structure of the cavity 22 provided in the wiring layer-attached glass substrate 21, dissipating the heat by utilization of evaporation heat, and discharging vapor containing the heat out of the grooves 111 in the slit structure.

It is possible to directly transmit heat of the semiconductor chip 16 to the porous layer 291 by using, as a portion of the evaporation layer, the slit structure of the grooves 111 in the cavity 22 formed in the wiring layer-attached glass substrate 21 without use of a thermally-conductive material, thus making it possible to efficiently discharge the heat of the semiconductor module 281.

As the porous layer 291, a heat-resistant resin material such as polyamide, polyimide or polycarbonate is used. It is to be noted that, as long as the high frequency characteristics are not influenced, a metal material such as a Cu fine wire may be used.

<Method of Manufacturing Semiconductor Module>

Next, processing of formation of the two-tier cavity 31 in the glass substrate 11 is described with reference to a flowchart of FIG. 24. Description is given of the processing of manufacturing using, as a subject, a manufacturing apparatus that performs processing of manufacturing of the semiconductor module 281. In the description, the process diagrams of FIGS. 25A, 25B, 25C, 26A, and 26B are referred to where appropriate.

It is to be noted that the processing of manufacturing of the semiconductor module 281 other than the processing of formation of the two-tier cavity 31 in the glass substrate 11 is basically the same as the processing of manufacturing of the semiconductor module 101 of FIG. 3, and thus the description thereof is omitted because of repetition.

In step S311, the manufacturing apparatus applies the HF resistant resist 151 to the glass substrate 11, and the protective sheet 152 is adhered to side, of the glass substrate 11, opposite to the application side of the HF resistant resist 151 (see FIG. 25A).

In step S312, the manufacturing apparatus performs resist patterning by UV exposure on the glass substrate 11 (see FIG. 25B).

In step S313, the manufacturing apparatus detaches, by HF etching, the HF resistant resist 151 from the glass substrate 11 that has been subjected to the resist patterning. This allows for formation of the cavity lower tier 31a (see FIG. 25C).

In step S314, the manufacturing apparatus embeds an HF resistant resist 301 in the cavity lower tier 31a of the glass substrate 11, and applies an HF resistant resist 302 to the outside of the cavity 31 to perform patterning (see FIG. 26A).

In step S315, the manufacturing apparatus detaches, by HF etching, the HF resistant resists 301 and 302 from the glass substrate 11 that has been subjected to the resist patterning. This allows for formation of the cavity upper tier 31b (see FIG. 25B).

In this way, the two-tier cavity 31 including the cavity lower tier 31a and the cavity upper tier 31b is formed, and the porous layer 291 is provided in the formed two-tier cavity 31. This allows the heat dissipation capacity to be enhanced.

It is to be noted that description has been given, in the above description, of the example where the cavity space is formed that functions as the heat pipe 41 and that is in the two-layer structure of the wiring layer-attached glass substrate 21 in which the cavity 22 is formed and the glass substrate 11 in which the cavity 31 is formed. Meanwhile, a cavity space in a three-layer structure functioning as the heat pipe 41 may be formed.

In this case, it is possible to provide wide spaces for the evaporation layer and the fluid layer of the heat pipe, thus making it possible to increase efficiency of cooling.

As described above, according to the present technology, the cavity space is provided as the heat pipe within the wiring-attached glass substrate, thus making it possible to install the heat dissipation part immediately below the heat source (semiconductor chip).

In addition, the heat pipe is formed by glass, and thus it is unlikely that a fluctuation in high frequency characteristics occurs.

The groove structure that serves as the evaporation layer of the heat pipe is provided in the cavity space, thus making it possible to enhance the heat dissipation capacity.

The present technology is applicable to a high-frequency module, a high-speed communication module, and the like.

The preferred embodiments of the present disclosure have been described in detail above with reference to the accompanying drawings, whilst the present disclosure is not limited to such examples. It is obvious that a person having ordinary skill in the art to which the present disclosure pertains may find various alterations or modifications within the scope of the technical idea set forth in the appended claims, and it should be understood that these alterations and modifications naturally come under the technical scope of the present disclosure.

APPLICATION EXAMPLE 1

The technology according to an embodiment of the present disclosure is applicable to various products. For example, the technology according to an embodiment of the present disclosure may be achieved as an apparatus to be mounted on a mobile body of any kind, such as an automobile, an electric vehicle, a hybrid electric vehicle, a motorcycle, a bicycle, any personal mobility device, an airplane, a drone, a vessel, and a robot, a construction machine, and an agricultural machine (tractor).

FIG. 27 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 27, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 27 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

FIG. 28 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 28 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 27, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), worldwide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 27, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 27 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the semiconductor module according to any of the embodiments described with reference to FIGS. 1, 2, 3, 4, 5, 6A, 6B, 6C, 7A, 7B, 8A, 8B, 8C, 9A, 9B, 10A, 10B, 11, 12, 13, 14A, 14B, 14C, 15A, 15B, 16A, 16B, 17, 18A, 18B, 18C, 19A, 19B, 20, 21, 22, 23, 24, 25A, 25B, 25C, 26A, and 26B is applicable to each section of the vehicle control system 7000 of FIG. 27. For example, the semiconductor module corresponds to the high-frequency module or the high-speed communication module of each section of the vehicle control system 7000. For example, application of the present technology to each section of the vehicle control system 7000 makes it possible to enhance a heat dissipation capacity without occurrence of a fluctuation in high frequency characteristics.

APPLICATION EXAMPLE 2

The technology according to an embodiment of the present disclosure is applicable to a technology called IoT (Internet of things) that is a so-called "Internet of things". The IoT is a mechanism in which IoT devices 9100 that are "things" are connected to another IoT device 9003, the Internet, a cloud 9005, or the like, to exchange information, thereby performing a mutual control. The IoT can be utilized in various industries such as agriculture, houses, automobiles, manufacturing, distribution, and energy.

FIG. 29 is a diagram illustrating an example of a schematic configuration of an IoT system 9000 to which the technology according to an embodiment of the present disclosure is applicable. The IoT devices 9001 include a variety of sensors such as temperature, humidity, illuminance, acceleration, distance, image, gas, and human sensors. Further, the IoT devices 9001 may additionally include terminals such as a smartphone, a mobile phone, a wearable terminal, and a gaming device. The IoT devices 9001 are powered, for example, by an alternating current (AC) power supply, a direct current (DC) power supply, a battery, a non-contact power supply, energy harvesting or the like. The IoT devices 9001 are capable, for example, of wired, wireless, and short-range wireless communication. Communication schemes suitably used are third-generation (3G)/LTE (registered trademark), wireless fidelity (Wi-Fi) (registered trademark), institute of electrical and electronic engineers (IEEE) 802.15.4, Bluetooth (registered trademark), Zigbee (registered trademark), and Z-Wave. The IoT devices 9001 may switch between the plurality of these communication sections to achieve communication.

The IoT devices 9001 may form one-to-one, star, tree, and mesh networks. The IoT devices 9001 may connect to the external cloud 9005 directly or via a gateway 9002. An address is assigned to each of the IoT devices 9001, for example, by internet protocol version (IPv) 4, IPv6, or IPv6 over low power wireless personal area networks (6LowPAN). Data collected from the IoT devices 9001 is sent to the other IoT device 9003, a server 9004, the cloud 9005, and so on. The timings and frequency for sending data from the IoT devices 9001 may be suitably adjusted for transmission of data in a compressed form. Such data may be used in an 'as-is' manner or analyzed by a computer 9008 by various sections such as statistical analysis, machine learning, data mining, cluster analysis, discriminant analysis, combinational analysis, and chronological analysis. Such use of data enables provision of numerous services including control, warning, monitoring, visualization, automation, and optimization.

The technology according to an embodiment of the present disclosure is also applicable to home-related devices and services. The IoT devices 9001 in homes include washing machine, drying machine, dryer, microwave oven, dish washing machine, refrigerator, oven, electric rice cooker, cooking appliances, gas appliances, fire alarm, thermostat, air-conditioner, television (TV) set, recorder, audio appliances, lighting appliances, electric water heater, hot water dispenser, vacuum cleaner, electric fan, air purifier, security camera, lock, door-shutter opener/closer, sprinkler, toilet, thermometer, weighing scale, sphygmomanometer and the like. Further, the IoT devices 9001 may include solar cell, fuel cell, storage battery, gas meter, electric power meter, and distribution panel.

A low power consumption communication scheme is desirable as a communication scheme for the IoT devices 9001 in homes. Further, the IoT devices 9001 may communicate by Wi-Fi indoors and by 3G/LTE (registered trademark) outdoors. An external server 9006 designed to control IoT devices may be provided on the cloud 9005 to control the IoT devices 9001. The IoT devices 9001 send data including statuses of home appliances, temperature, humidity, power consumption, and presence or absence of humans and animals indoors and outdoors. Data sent from the home appliances is accumulated in the external server 9006 via the cloud 9005. New services are made available based on such data. The IoT devices 9001 designed as described above can be controlled by voice using voice recognition technologies.

In addition, direct transmission of information from the home appliances to the TV set permits visualization of the statuses of the home appliances. Further, determination of whether or not the resident is at home and transmission of data to air-conditioners and lighting appliances by various sensors makes it possible to turn the power thereof on and off. Still further, advertisements can be shown on the displays provided to various home appliances via the Internet.

Description has been given hereinabove of an example of the IoT system 9000 to which the technology according to an embodiment of the present disclosure is applicable. The technology according to an embodiment of the present disclosure is suitably applicable as a semiconductor module of each of the IoT devices 9001 among the configurations described above. Application of the technique according to the present disclosure to the IoT devices 9001 makes it possible to enhance a heat dissipation capacity without occurrence of a fluctuation in high frequency characteristics.

It is to be noted that the present technology may also have the following configurations.

(1)

A semiconductor device including: a wiring layer-attached glass substrate; a glass substrate that is adhered to the wiring layer-attached glass substrate; and a heat dissipation part that is formed between the wiring layer-attached glass substrate and the glass substrate.

(2)

The semiconductor device according to (1), in which the heat dissipation part is formed below a chip that is mounted on the wiring layer-attached glass substrate.

(3)

The semiconductor device according to (1) or (2), in which a first cavity is formed as the heat dissipation part in the glass substrate.

(4)

The semiconductor device according to (3), in which a coolant is sealed in the first cavity.

(5)

The semiconductor device according to (4), in which the coolant includes water, alcohol, or an alternative for chlorofluorocarbon.

(6)

The semiconductor device according to any one of (3) to (5), in which a second cavity that faces the first cavity is formed as the heat dissipation part in the wiring layer-attached glass substrate.

(7)

The semiconductor device according to (6), in which grooves are provided within the second cavity.

(8)

The semiconductor device according to (7), in which the grooves have a slit structure.

(9)

The semiconductor device according to (7), in which the grooves have a lattice structure.

(10)

The semiconductor device according to any one of (1) to (9), in which the wiring layer-attached glass substrate and the glass substrate are joined together to be adhered to each other by forming an inorganic film on the glass substrate.

(11)

The semiconductor device according to (10), in which the inorganic film includes a silicon thin film or an aluminum thin film.

(12)

The semiconductor device according to any one of (1) to (9), in which the wiring layer-attached glass substrate and the glass substrate are joined together to be adhered to each other by applying a resin to the glass substrate.

(13)

The semiconductor device according to (12), in which the resin includes a thermosetting resin or a UV curable resin.

(14)

The semiconductor device according to any one of (3) to (9), in which a porous layer is provided in the first cavity.

(15)

The semiconductor device according to (14), in which the porous layer includes a heat-resistant resin.

(16)
The semiconductor device according to (15), in which the heat-resistant resin includes polyimide, polyamide or polycarbonate.
(17)
The semiconductor device according to (14), in which the porous layer includes metal.
(18)
The semiconductor device according to (17), in which the metal includes copper.

REFERENCE NUMERALS LIST 1 semiconductor module
10 glass wiring substrate
11 glass substrate
12 glass substrate
13 wiring layer
14 inorganic film
15 bump
16 semiconductor chip
21 wiring layer-attached glass substrate
22 cavity
31 cavity
32 coolant
41 heat pipe
61 evaporation part
62 condensation part
101 semiconductor module
111 groove
151 HF resistant resist
152 protective sheet
201 coolant-sealing groove
202 solder
211 copper pipe
212 solder
222 resin
231 semiconductor module
251 semiconductor module
261 groove
281 semiconductor module
291 porous layer

The invention claimed is:

1. A semiconductor device, comprising:
a first glass substrate, wherein the first glass substrate is a wiring layer-attached glass substrate; and
a second glass substrate on the wiring layer-attached glass substrate, wherein
the second glass substrate includes:
a top surface; and
a first cavity in the top surface as a heat dissipation part of the semiconductor device,
the first cavity includes an upper cavity part and a lower cavity part,
the lower cavity part has a length smaller than a length of the upper cavity part,
the upper cavity part is closer to the top surface than the lower cavity part,
the upper cavity part includes a porous layer, and
the porous layer has a length longer than the length of the lower cavity part.

2. The semiconductor device according to claim 1, wherein
the heat dissipation part is below a chip, and
the chip is on the wiring layer-attached glass substrate.

3. The semiconductor device according to claim 2, further comprising an inorganic film on the second glass substrate, wherein the first glass substrate is joined to the second glass substrate via the inorganic film.

4. The semiconductor device according to claim 3, wherein the inorganic film comprises one of a silicon thin film or an aluminum thin film.

5. The semiconductor device according to claim 2, further comprising a resin on the second glass substrate, wherein the first glass substrate is joined to the second glass substrate via the resin.

6. The semiconductor device according to claim 5, wherein the resin comprises one of a thermosetting resin or a UV curable resin.

7. The semiconductor device according to claim 1, wherein the lower cavity part of the first cavity includes a coolant.

8. The semiconductor device according to claim 7, wherein the coolant comprises one of water or alcohol.

9. The semiconductor device according to claim 1, wherein
the first glass substrate includes a second cavity,
the second cavity is opposite to the first cavity, and
each of the first cavity and the second cavity corresponds to the heat dissipation part.

10. The semiconductor device according to claim 9, wherein the second cavity includes a plurality of grooves.

11. The semiconductor device according to claim 10, wherein each groove of the plurality of grooves has a slit structure.

12. The semiconductor device according to claim 10, wherein grooves of the plurality of grooves have a lattice structure.

13. The semiconductor device according to claim 1, wherein the porous layer includes a heat-resistant resin.

14. The semiconductor device according to claim 13, wherein the heat-resistant resin comprises one of polyimide, polyamide, or polycarbonate.

15. The semiconductor device according to claim 1, wherein the porous layer includes a metal.

16. The semiconductor device according to claim 15, wherein the metal comprises copper.

* * * * *